(12) United States Patent
Hata et al.

(10) Patent No.: US 7,100,278 B2
(45) Date of Patent: Sep. 5, 2006

(54) COMPONENT MOUNTING APPARATUS AND METHOD

(75) Inventors: Kanji Hata, Katano (JP); Noriaki Yoshida, Ikeda (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 136 days.

(21) Appl. No.: 10/079,494

(22) Filed: Feb. 22, 2002

(65) Prior Publication Data

US 2002/0112346 A1 Aug. 22, 2002

Related U.S. Application Data

(63) Continuation-in-part of application No. 09/010,490, filed on Jan. 21, 1998, now Pat. No. 6,789,310, which is a continuation of application No. 08/740,992, filed on Nov. 5, 1996, now Pat. No. 5,778,525.

(30) Foreign Application Priority Data

Nov. 6, 1995 (JP) ............................. 7-286969

(51) Int. Cl.
H05K 3/30 (2006.01)
B23P 19/00 (2006.01)

(52) U.S. Cl. ............................. 29/834; 29/739; 29/743; 29/832; 414/752.1

(58) Field of Classification Search ............... 29/705, 29/720, 739–741, 743, 832–834, 714, 564.1, 29/836, 726; 294/64.1, 2; 414/752.1, 751.1, 414/737; 198/586
See application file for complete search history.

(56) References Cited

U.S. PATENT DOCUMENTS

| | | |
|---|---|---|
| 3,650,140 A | 3/1972 | Zmuda |
| 4,231,153 A | 11/1980 | Browne |
| 4,480,780 A | 11/1984 | Claeskens et al. .......... 228/180 |
| 4,573,262 A | 3/1986 | Dornes et al. ................. 29/739 |
| 4,624,050 A | 11/1986 | Hawkswell ................... 29/740 |
| 4,631,812 A | 12/1986 | Young .......................... 29/714 |
| 4,875,285 A | 10/1989 | Haan et al. |
| 5,002,448 A * | 3/1991 | Kamijima et al. ............ 29/739 |
| 5,115,559 A | 5/1992 | Oyama ......................... 29/720 |
| 5,153,983 A | 10/1992 | Oyama |
| 5,191,702 A | 3/1993 | Goedecke et al. ............ 29/742 |
| 5,233,745 A * | 8/1993 | Morita ......................... 29/705 |
| 5,323,528 A | 6/1994 | Baker |
| 5,410,801 A | 5/1995 | Shiloh et al. .................. 29/740 |
| 5,456,001 A | 10/1995 | Mori et al. |
| 5,541,834 A | 7/1996 | Tomigashi et al. ..... 364/167.01 |
| 5,579,572 A | 12/1996 | Kashiwagi et al. |
| 5,651,176 A | 7/1997 | Ma et al. |

(Continued)

FOREIGN PATENT DOCUMENTS

EP 0453369 10/1991

(Continued)

Primary Examiner—A. Dexter Tugbang
Assistant Examiner—Donghai D. Nguyen
(74) Attorney, Agent, or Firm—Wenderoth, Lind & Ponack, L.L.P.

(57) ABSTRACT

A component mounting apparatus have a pair of component supply sections, and first and second mounting head sections. Each of the first and second head sections has a rotary member driven about a horizontal axis, component suction nozzles attached to the rotary member, driving mechanisms for rotating corresponding component suction nozzle, and a recognition section for recognizing components sucked by the component suction nozzle. Each of the first and second mounting head section performs successive suction, recognition, posture adjustment, and mounting of the components.

38 Claims, 31 Drawing Sheets

U.S. PATENT DOCUMENTS

| | | |
|---|---|---|
| 5,692,292 A | 12/1997 | Asai et al. |
| 5,711,065 A | 1/1998 | Asai et al. |
| 5,740,604 A | 4/1998 | Kitamura et al. |
| 5,741,114 A | 4/1998 | Onodera |
| 5,743,001 A | 4/1998 | Baker et al. |
| 5,743,005 A | 4/1998 | Nakao et al. |

FOREIGN PATENT DOCUMENTS

| | | |
|---|---|---|
| JP | 54-043381 | 4/1979 |
| JP | 60-7200 | 1/1985 |
| JP | 63-178596 | 7/1988 |
| JP | 1-187898 | 7/1989 |
| JP | 2-54999 | 2/1990 |
| JP | 3-30499 | 2/1991 |
| JP | 03-131100 | 6/1991 |
| JP | 03-203294 | 9/1991 |
| JP | 06-077693 | 3/1994 |
| JP | 61-39000 | 5/1994 |
| JP | 07-227787 | 1/1995 |
| JP | 07-136875 | 5/1995 |
| JP | 9-130084 | 5/1997 |
| SU | 1829131 | 5/1991 |
| WO | 85/03404 | 8/1985 |

* cited by examiner

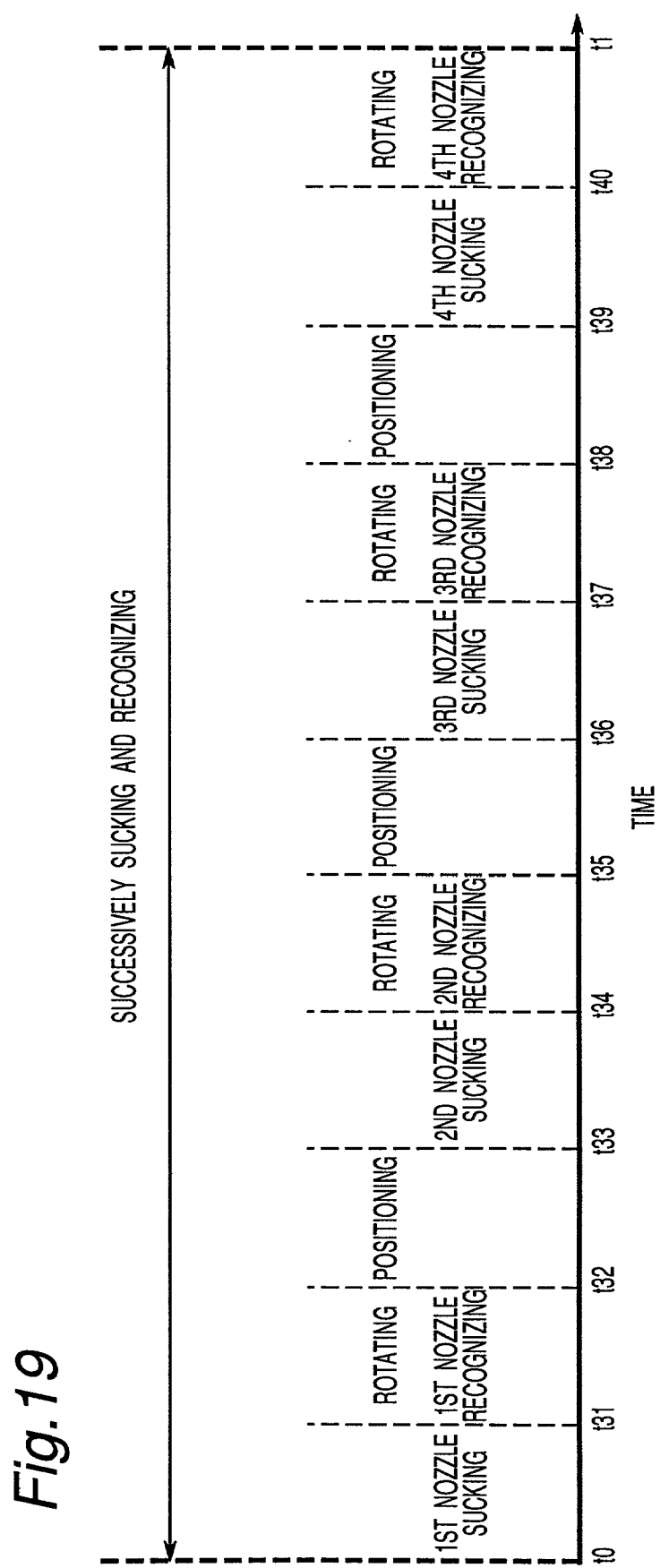

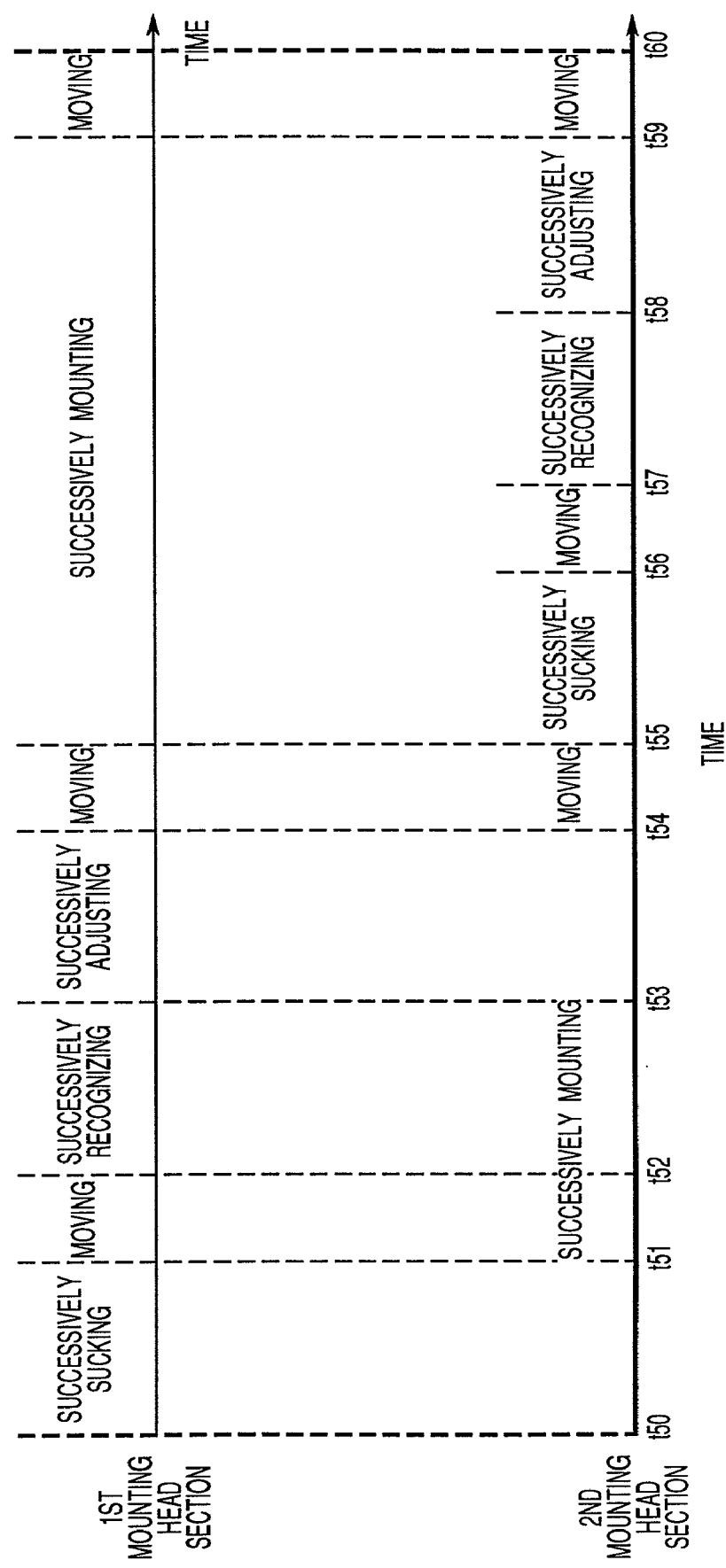

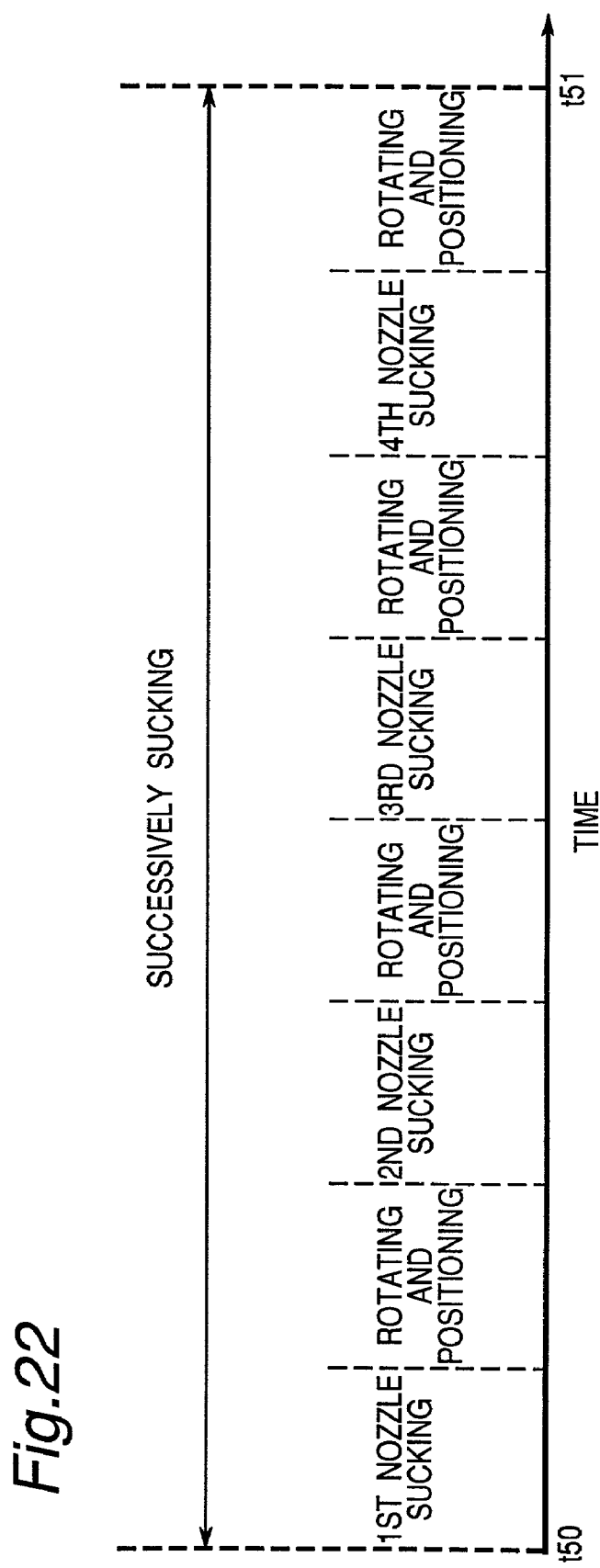

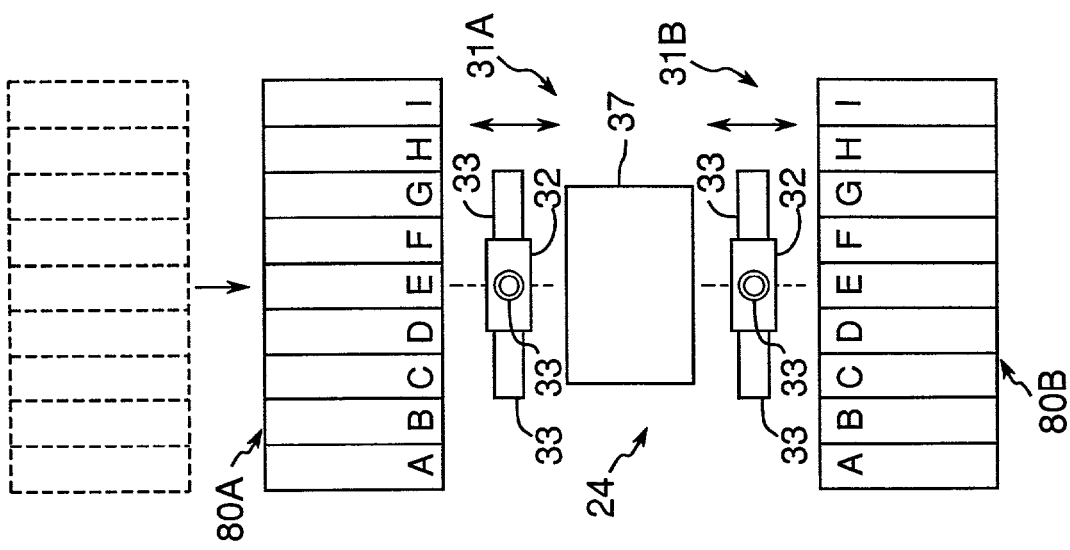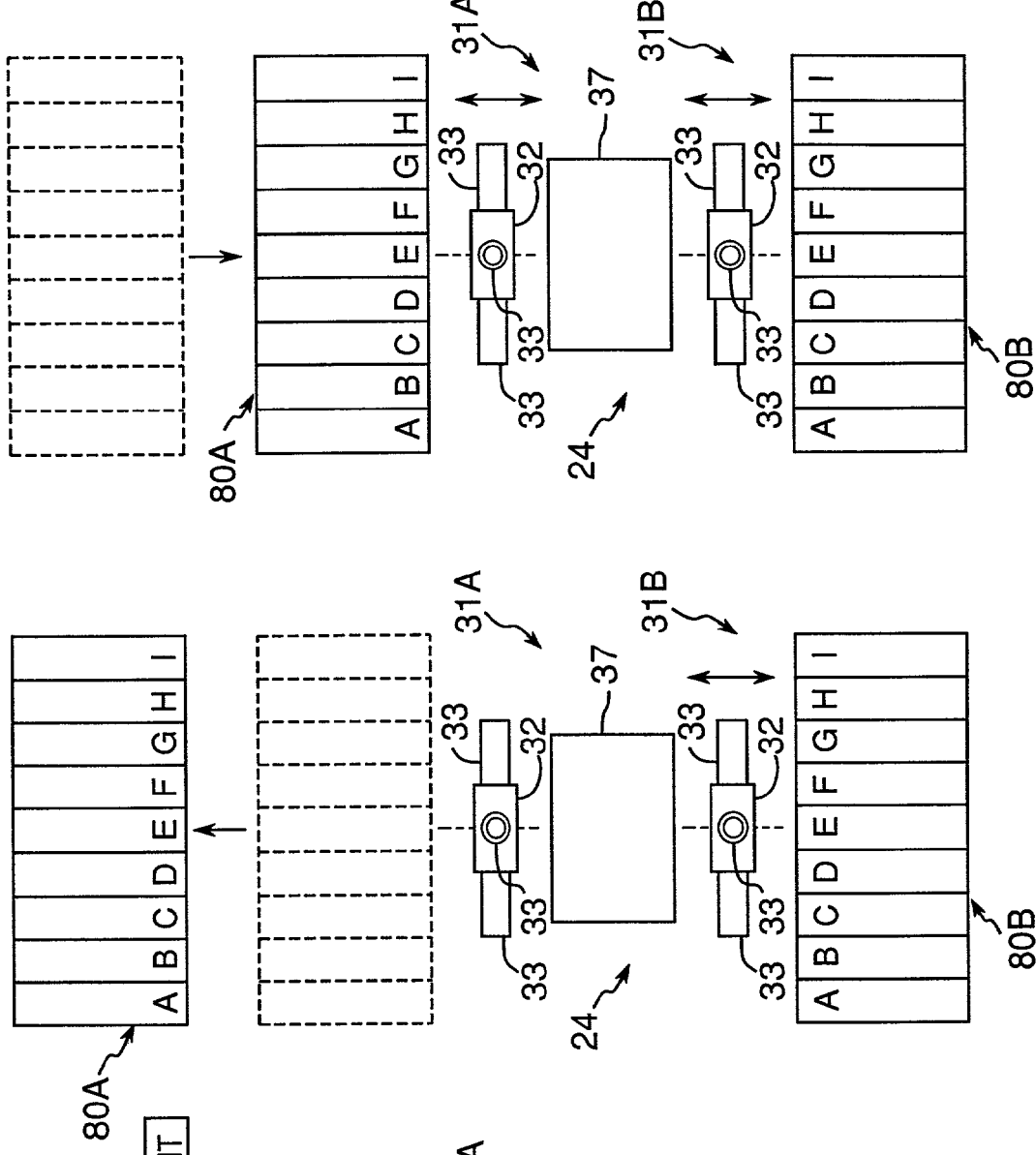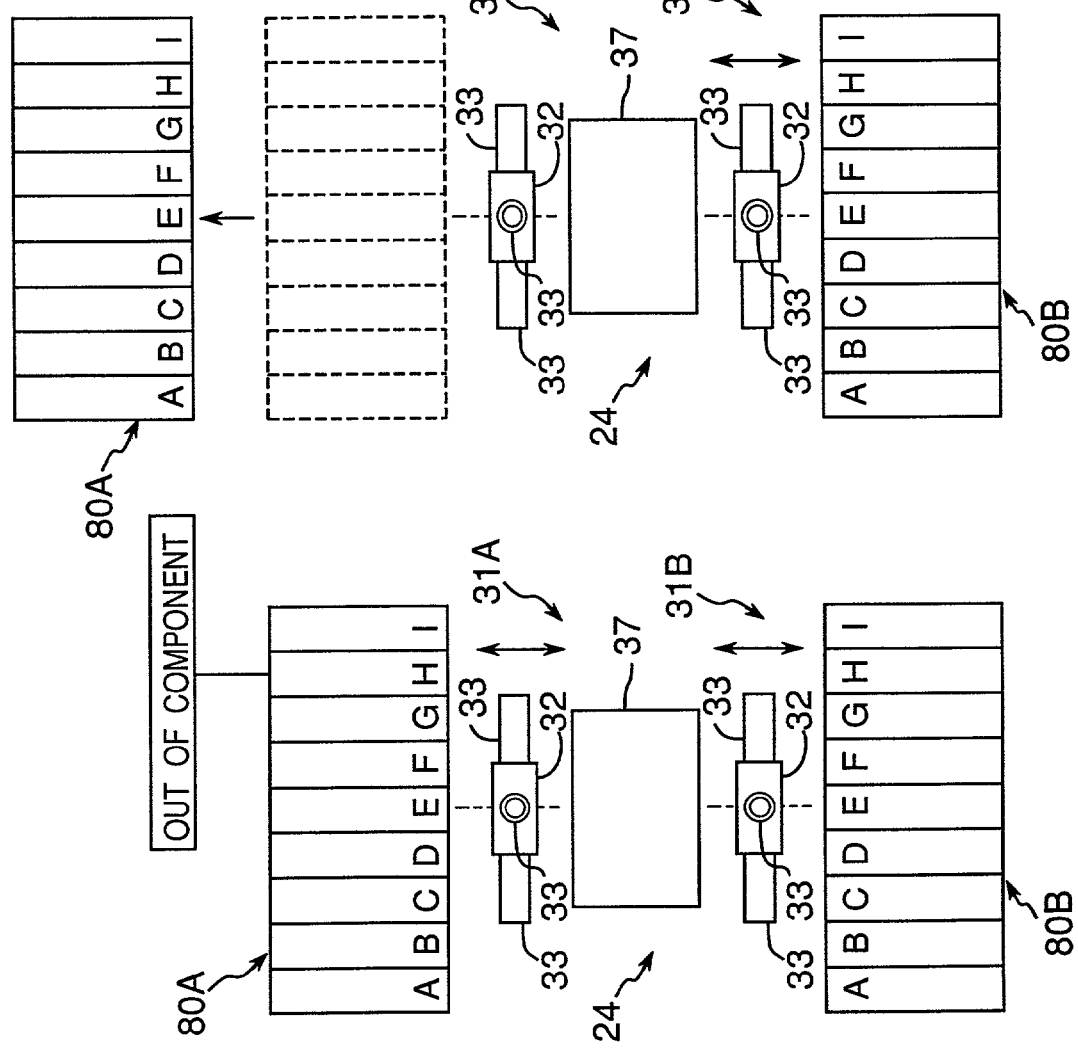

COMPONENT MOUNTING APPARATUS AND METHOD

CROSS REFERENCE OF RELATEING APPLICATIONS

This application is a continuation-in-part of application Ser. No. 09/010,490, filed Jan. 21, 1998, now U.S. Pat. No. 6,789,310 which is a continuation of Ser. No. 08/740,992, filed Nov. 5, 1996, now U.S. Pat. No. 5,778,525.

BACKGROUND OF THE INVENTION

The present invention relates to component mounting apparatus and method for automatically mounting a variety of components such as electronic components onto a printed circuit board or the like, and a component mounting equipment including the apparatuses.

Generally, in an electronic component mounting apparatus, a number of component supply means are mounted in parallel to one another on a component supply table. In a component mounting stage, the component supply means are successively positioned in a specified component supply position according to a sequence of mounting components while moving the component supply table in a direction in which the component supply means are arranged in parallel. Then, each of the components at the component supply means is taken out by suction by a mounting head section, and the components are transferred to a circuit board positioned in the circuit board positioning section to be subjected to a component mounting process.

This type of conventional component mounting apparatus will be described with reference to FIG. 33 showing a perspective view of it and FIG. 34 showing a schematic plan view of it. In FIG. 33, at the front of an apparatus body 1 is provided a board positioning section 4 for positioning a circuit board P supplied from a board supply means 2 in a mounting position, and the circuit board P mounted with the required components in the board positioning section 4 is discharged by a board discharge means 3. On the other hand, at the rear of the apparatus body 1 is provided a component supply section 7, and a rotary type mounting head section 8 is provided between the component supply section 7 and the aforementioned board positioning section 4 as shown in FIG. 7.

In the component supply section 7, two component supply tables 10 and 11 are laterally movably provided independently of each other on a guide rail 9. The component supply tables 10 and 11 are mounted with a number of component supply means 12 arranged in parallel to one another in a direction in which the component supply tables 10 and 11 move. There is illustrated generally a so-called parts cassette as the component supply means 12, and it will be simply described below. That is, electronic components of an identical type are stored and arranged at regular intervals on a carrier tape while being wound around a reel 13 as covered with a cover tape. By drawing out the carrier tape from the reel 13 to feed it at a pitch equal to the storage intervals of the components and taking up the cover tape, the electronic component located at the leading end is positioned in a component supply position A opposite to a component suction head 14 of the mounting head section 8.

Furthermore, as shown in FIG. 34, the mounting head section 8 is constructed by providing a plurality of component suction heads 14 at regular angular intervals on an identical circle of a rotary table (not shown) provided rotatably around a vertical axis. Each component suction head 14 is designed to suck a component by vacuum suction means. Upon intermittently rotating the rotary table, it is stopped in steps in the component supply position A and a component mounting position B in order to concurrently perform receiving of each component from the component supply means 12 and mounting of each component onto the circuit board P. While one component supply table 10 is supplying components, the other component supply table 11 that is retreating in a standby position performs changing of component supply means 12 and replenishing of components thereby achieving preparation so that the component mounting apparatus can be operated continuously.

In recent years, there has been a growing trend in that the types of circuit boards P to be manufactured and the types of components to be mounted on the circuit boards P are increasing. In order to cope with the above, one solution to be considered is to increase the number of component supply means 12 mounted on the component supply tables 10 and 11. However, in such a case, the component supply tables 10 and 11 are to be elongated sidewise in order to increase the number of component supply means 12. Consequently, the length of the entire component supply section 7 becomes very long, and this leads to a degraded space utilization efficiency, reducing the productivity per floor area.

A more important issue is that the component supply tables 10 and 11 are fed at a pitch in accordance with taking out the components by the mounting head section 8, and therefore, the following inconvenience occurs. That is, when the component supply tables 10 and 11 increase in weight due to the increase of their lengths, not only is a greater drive power required to move the component supply tables 10 and 11 but also the inertial force of the component supply tables 10 and 11 increases. Therefore, vibration in feeding the component supply tables 10 and 11 at a pitch significantly increases. Consequently, it is impossible to increase the component supply rate, or the component mounting operation speed.

SUMMARY OF THE INVENTION

Accordingly, it is an object of the present invention to provide a component mounting apparatus and method capable of increasing the component mounting operation speed without dimensionally increasing the whole apparatus even when the types of boards and the number of components to be mounted on each board increase.

In accomplish these and other objects, according to a first aspect of the present invention, there is provided a component mounting apparatus comprising: a pair of component supply sections for accommodating a plurality of components, the component supply sections being arranged on opposite sides of a board positioning section; a first mounting head section comprising a rotary member adapted to be rotatively driven about a horizontal axis, a plurality of component suction nozzles attached to the rotary member along respective axes which each intersect the horizontal axis, and a recognition section opposed to the rotary member, the first mounting head section being operable to perform successive suction operations in order to pick up the components with the plural component suction nozzles and to perform successive recognition operations of the components respectively sucked by the component suction nozzles by the recognition section upon intermittent rotation of the rotary member at one of the component supply sections, and the first mounting head section being operable to successively mount the components respectively sucked by the component suction nozzles onto the board upon intermittent rotation of the rotary member at the board positioning section; and a second mounting head section comprising a rotary member adapted to be rotatively driven about a horizontal axis, a plurality of component suction nozzles attached to the rotary member along respective axes which each intersect the horizontal axis, and a recognition section opposed to the rotary member, the second mounting head section being operable to successive suction operations in order to pick up the components with the plural component suction nozzles and to perform successive recognition operations of the components respectively sucked by the component suction nozzles by the recognition section upon intermittent rotation of the rotary member at the other of the component supply sections, and the second mounting head section being operable to successively mount the components respectively sucked by the component suction nozzles onto the board upon intermittent rotation of the rotary member at the board positioning section.

With this arrangement, the component supply sections are installed fixedly, and therefore it becomes free of vibration regardless of a size thereof. The mounting head sections is a robot type which sucks a plurality of components from the component supply table at one time and thereafter successively mounts the components to specified sections of the board. Therefore even if the number of the components to be mounted increases, the component mounting operation speed can be remarkably increased further than that in conventional apparatus in which the component supply table is fed at a pitch with respect to the rotary type mounting head section.

Further, the components can be mounted by the two of the first and second mounting head sections onto the board positioned at the single board positioning section, and therefore the component mounting speed can be further increased.

Furthermore, the first and second mounting head sections respectively perform the successive suction, recognition, and mounting of the components, and therefore the component mounting speed can be more further increased.

It is preferable that each of the first and second mounting head sections comprises a plurality of nozzle rotation driving mechanisms for rotating the corresponding component suction nozzle around the respective axes with respect to the rotary member, and each of the component suction nozzles of the first and second mounting head sections can be rotated around the axes thereof by the nozzle rotation driving mechanism in accordance with recognition results from the recognition section, thereby performing successive adjustment of postures of the components sucked by the component suction nozzles.

With this arrangement, adjustments of postures of the components sucked by the first and second mounting head sections can be successively performed, and therefore more faster mounting operation speed can be achieved.

Specifically, the rotary members of the first and second mounting head sections can be intermittently rotated at regular angular intervals at the component supply table, and wherein at an angular position of the rotary member where one of the component suction nozzles is opposed to the component of the component supply table, another one of the component suction nozzles is opposed to the recognition section.

Alternatively, the rotary members of the first and second mounting head sections can be intermittently rotated at regular angular intervals at the component supply table, and wherein the component sucked by one of the component suction nozzle is opposed to the recognition section during the rotation of the rotary member.

Each of the first and second mounting head sections may comprise an illuminator for illuminating the components sucked by the component suction nozzles when each of the components is opposed to the recognizing section.

It is preferable that each of the first and second mounting head sections comprises a head main body which includes the rotary member, a frame which supports the head main body and the recognition section, and an elevation mechanism for elevating the head main body with respect to the frame.

Alternatively, each of the first and second mounting head sections may comprise a head main body which includes the rotary member, a frame which supports the head main body and the recognition section, and an elevation mechanism for elevating the frame.

It is preferable that the rotary members of the first and second mounting head sections are adapted to rotate at lower speed at the end of the rotation with respect to the speed at the start of the rotation.

With this arrangement, an influence of an inertial force is suppressed so that the rotary member can be reliably stopped at a correct angular position. Therefore, the components suction nozzles can be positioned with respect to the components supplied from the components supply tables and the board at the board positioning section with high precision.

The first and second mounting head sections are independently movable between the component supply sections and the board positioning section, and the first mounting head section can perform successive mounting of components onto the board positioned at the board positioning section while the second mounting head section performs successive component suction and recognition operation at the component supply section.

One of the first and second mounting head section is adapted to mount components at high speed, and the other of the first and second mounting head sections is adapted to mount components that require mounting with a high degree of precision.

Alternatively, either the first or second mounting head section can be selectively operated in accordance with a type of the board positioned at the board positioning section, and one of the first and second mounting head sections is adapted to mount larger components, and the other of the first and second mounting head sections is adapted to mount smaller components.

It is preferable that the first or second mounting head section performs suction of larger components after finishing suction of smaller components.

Further, it is preferable that the first or second mounting head section performs mount operations of smaller components after mounting larger components.

These sequences of execution of the suction and mounting of the components suppresses the influence of the inertial force, resulting in that the rotary member can be reliably stopped at a correct rotation angular position. Therefore, the component suction nozzles can be positioned with respect to the components supplied from the component supply table and the board at the board positioning section with high accuracy.

According to a second aspect of the present invention, there is provided a component mounting apparatus comprising: a pair of component supply sections for accommodating a plurality of components, the component supply sections being arranged on opposite sides of a board positioning section; first and second mounting head sections, each of the first and second mounting head sections comprising a rotary member capable of being rotatively driven about a horizontal axis, a plurality of component suction nozzles attached to the rotary member along axes which each intersect the horizontal axis, and a plurality of nozzle rotating driving mechanisms for rotating the component suction nozzles respectively; and first and second recognition sections for recognizing each of the components sucked by the first and second mounting head sections, wherein each of the first and second mounting head sections is operable to successively suck the components by the component suction nozzles upon rotation of the rotary member at one of the component supply sections, move to one of the first and second recognition sections to perform successive recognition of the components sucked by the component suction nozzles upon rotation of the rotary member, rotate the component suction nozzles around respective axes thereof by the respective nozzle rotation driving mechanisms in accordance with recognition results from the recognizing section thereby performing successive adjustment of postures of the components sucked to the component suction nozzles, and successively mount the components sucked by the plural component suction nozzles onto the board upon rotation of the rotary member at the board positioning section.

According to a third aspect of the present invention, there is provided a method of mounting components, the method comprising: positioning a mounting head section with respect to a component supply section; successively sucking components supplied from the component supply section by component suction nozzles attached to a rotary member of the mounting head section, wherein the component suction nozzles intersect a horizontal axis of the rotary member, and the components are sucked by rotating the rotary member about the horizontal axis; recognizing the components sucked by the component suction nozzles by a recognition section, wherein the sucking and recognizing operation are performed simultaneously; rotating the component suction nozzles around axes thereof with respect to the rotary member in accordance with recognition results from the recognizing section, thereby performing successive adjustment of postures of the components sucked by the component suction nozzles; positioning the mounting head section with respect to a board; and successively mounting the components sucked by respective component suction nozzles onto the board by intermittently rotating the rotary member of the mounting head section. The recognition operation may be performed after the suction operation.

With this method, the suction, recognition, and mounting of the components are successively performed, and therefore the mounting operation speed can be increased.

In this method, it is preferable that the mounting head section comprises a first and second mounting head sections, and the component supply section comprises a first and second component supply section respectively corresponding to the first and second mounting head sections. It is preferable that the method further comprises: halting the successive suction, recognition, adjustment, and mounting operations of the components by one of the first and second mounting head sections when one of the component supply sections corresponding to said one mounting head section needs to be replenished with components, while continuing the successive suction, recognition, adjustment, and mounting operations of the components by the other of the first and second mounting head sections; detaching the one of the component supply sections to permit it to be replenished with components; replenishing the one of the component supply sections with components; reattaching the one of the component supply sections following the replenishment thereof; and restarting the successive suction, recognition, adjustment, and mounting operations by the one of the first and second mounting head sections.

With this method, one of the first and second mounting head sections is only halted for performing replenishment of the components thereto, thereby keeping reduction of a productivity to a minimum.

BRIEF DESCRIPTION OF THE DRAWINGS

These and other objects and features of the present invention will become clear from the following description taken in conjunction with the preferred embodiments thereof with reference to the accompanying drawings, in which:

FIG. 19 is a time chart for describing successively sucking and recognizing in the third embodiment of the present invention;

FIG. 21 is a time chart for describing an operation of a component mounting apparatus according to a fourth embodiment of the present invention;

FIG. 22 is a time chart for describing successively sucking in the fourth embodiment;

FIGS. 32A through 32C are schematic plan views for describing a method for replenishing components to a component supply table;

DETAILED DESCRIPTION OF THE EMBODIMENTS

Figure 1:
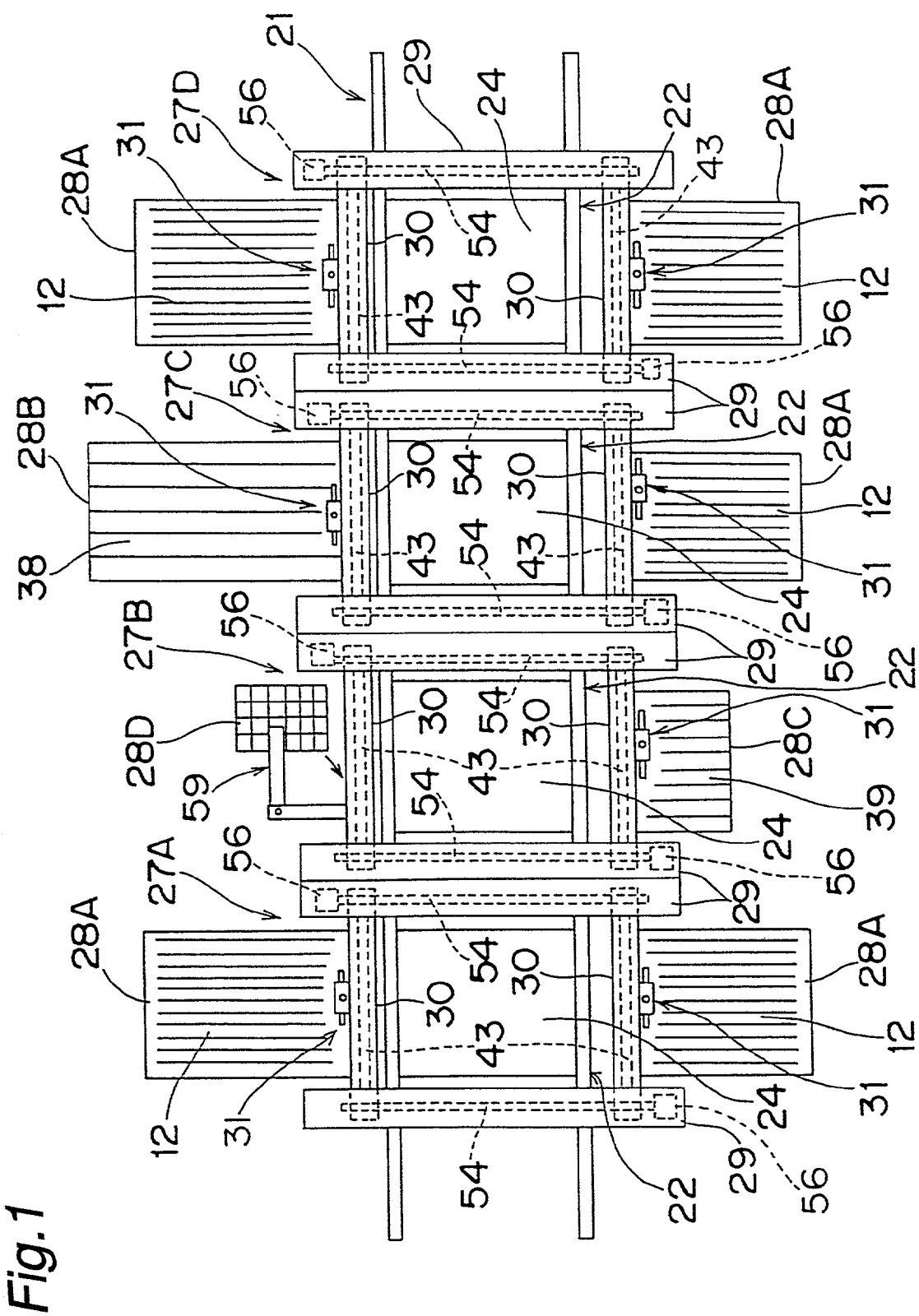
FIG. 1 is a schematic plan view schematically showing component mounting equipment according to an embodiment of the present invention.

Before the description of the present invention proceeds, it is to be noted that like parts are designated by like reference numerals throughout the accompanying drawings.

First Embodiment

A first embodiment of the present invention will be described below with reference to FIGS. 1 through 4.

FIG. 1 is a schematic plan view schematically showing component mounting equipment (component mounting line) according to an embodiment of the present invention. In the figure, four component mounting apparatuses 27A through 27D are provided along a board transfer path 21, and four board transfer means 22 are provided for the component mounting apparatuses 27A through 27D along the board transfer path 21 in the lateral direction so that each board transfer means 22 supplies a circuit board to be mounted with components to a board mounting position of one of the component mounting apparatuses 27A through 27D and discharges the circuit board therefrom. The component mounting apparatuses 27A through 27D have an identical basic structure, and therefore, the component mounting apparatus 27D is taken as an example to be described below with reference to FIG. 2 that shows a perspective view of it and FIG. 3 that shows a plan view of its operating mechanism section.

Figure 2:
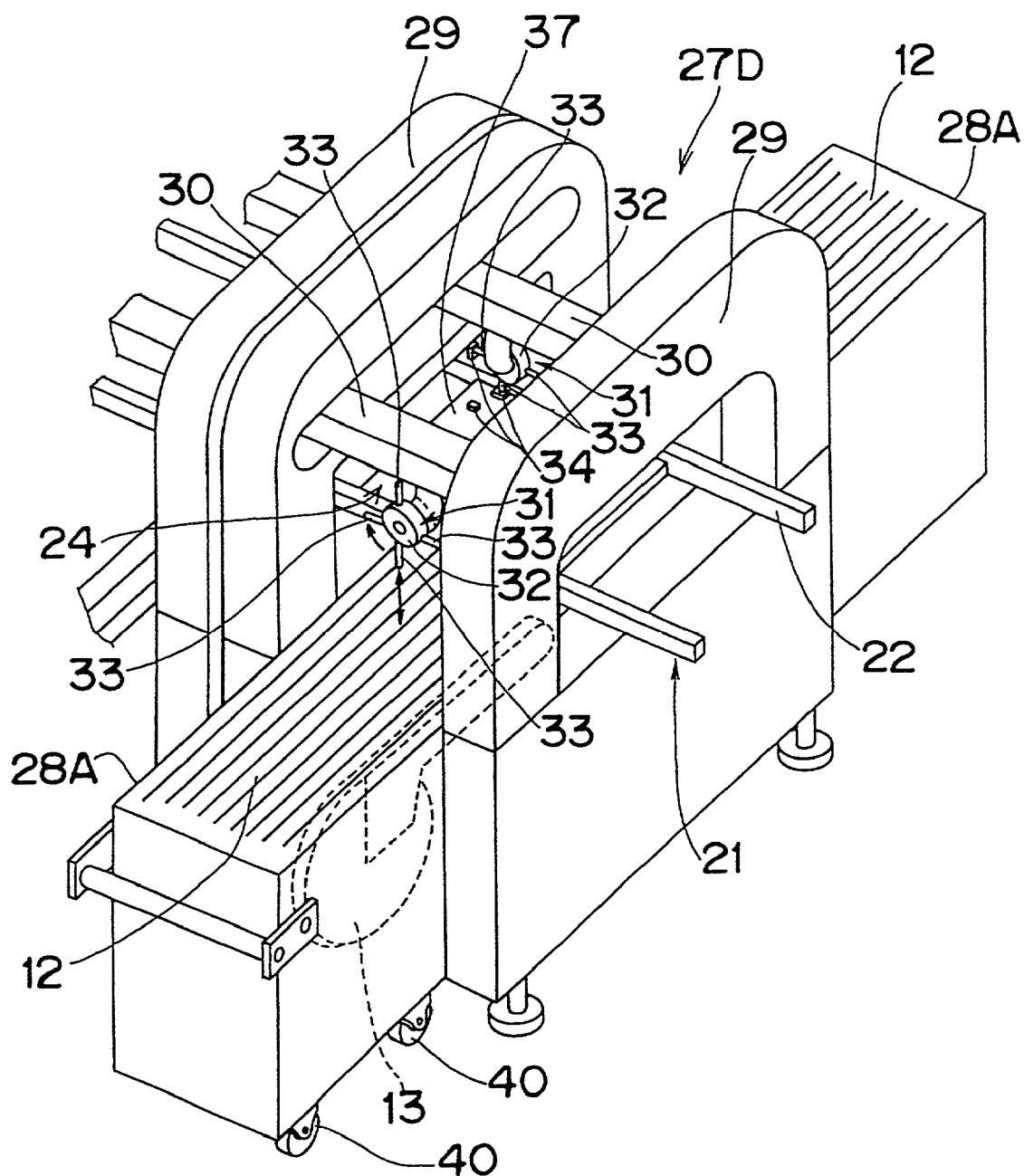
FIG. 2 is a perspective view of a first embodiment of the component mounting apparatus of the present invention, the apparatus being a part of the above equipment.

In the component mounting apparatus 27D shown in FIG. 2, a laterally provided pair of inverted U-shaped support frames 29 are arranged in parallel to each other along the board transfer path 21 while allowing the board transfer path 21 to penetrate them. Between both these support frames 29 are arranged two operating frames 30 in parallel to each other across the frames 29. The operating frames 30 are supported individually movably in a direction perpendicular to the board transfer path 21. To each operating frame 30 is mounted a mounting head section 31 movably along the operating frame 30. At the mounting head section 31, four component suction nozzles 33 are provided at regular intervals (at intervals of 90 degree.) around a rotary member 32 that is rotatably supported around a horizontal axis. Upon rotating the rotary member 32 at a pitch equal to each interval of the component suction nozzles 33, the component suction nozzles 33 are selectively and sequentially directed downward to suck a component 34 from a component supply table 28A and mount the sucked component 34 onto a circuit board 37 located at the board mounting position where the circuit board 37 is positioned by a board positioning section 24.

Between both the support frames 29 are inserted the component supply tables 28A from both depthwise sides as moved by casters 40, and thereafter they are fixedly installed in specified positions. The component supply table 28A is provided with component supply means 12 comprised of parts cassettes provided with the aforementioned reels 13. Other than this, as shown in FIG. 1, a component supply table 28B mounted with a stick-shaped component supply means 38 at which components stored in a pipe member are successively fed to a take-out position, a component supply table 28C on which bulk components 39 are placed, and a tray-shaped component supply table 28D are installed at the component mounting apparatuses 27A through 27D. It is to be noted that the tray-shaped component supply table 28D is provided with a mounting head section 59 having a pivot arm shape for taking out the components thereof.

Figure 3:
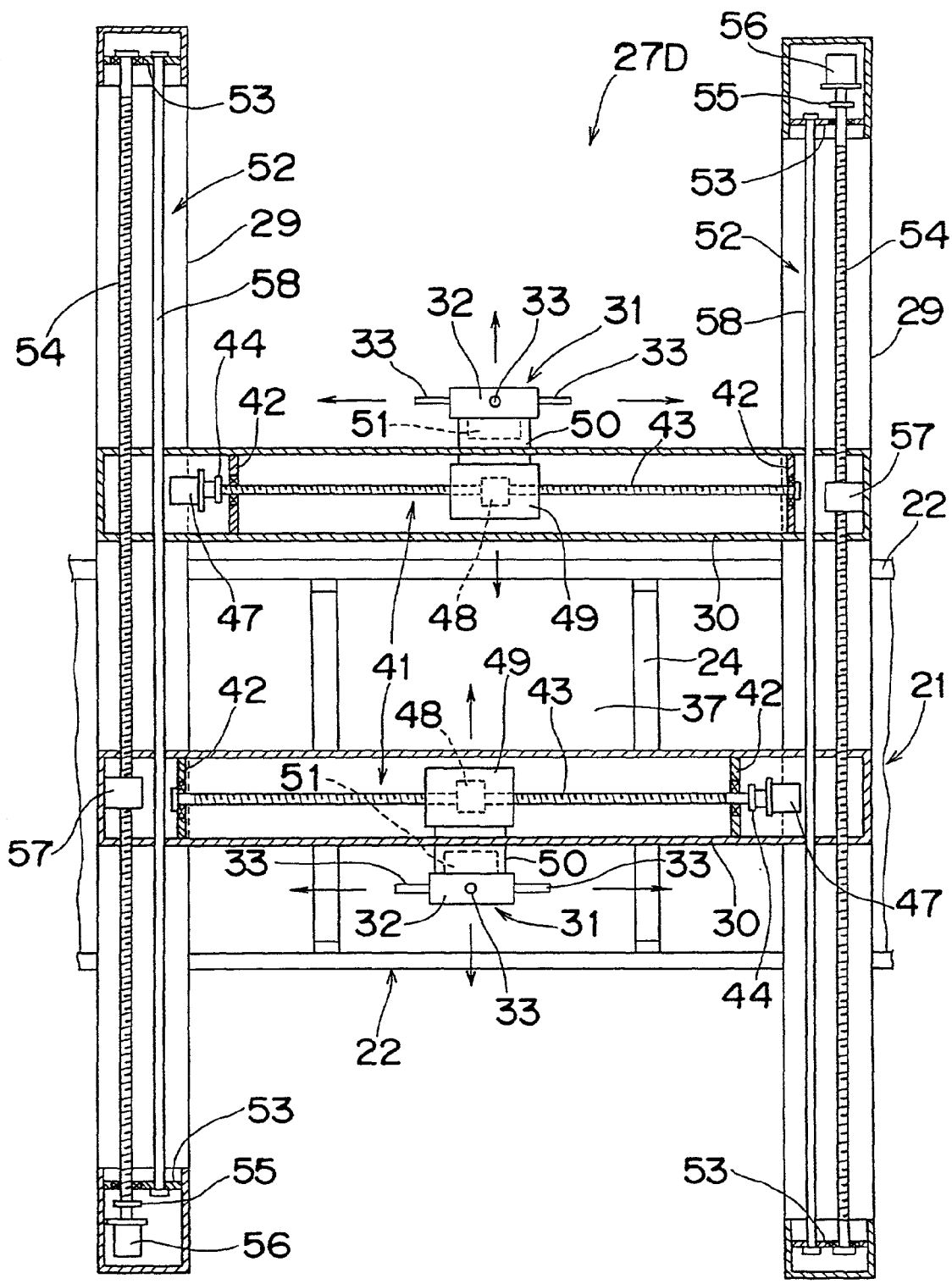
FIG. 3 is a plan view of an operating mechanism section of the above apparatus.

In FIG. 3, each operating frame 30 houses therein a head positioning mechanism section 41 for moving the mounting head section 31 in the lengthwise direction of the board transfer path 21.

The head positioning mechanism section 41 is comprised of a ball thread 43 that is rotatably supported across a pair of support plates 42 fixed to both ends of each operating frame 30, a step motor 47 for rotatively driving the ball thread 43 via a connecting means 44, and a moving member 49 in which a nut 48 meshed with the ball thread 43 is internally fixed and moved in accordance with the rotation of the ball thread 43. The mounting head section 31 is fixed to the moving member 49 via a head holder 50, and the head holder 50 is internally provided with a known head elevation mechanism section 51 for vertically moving the mounting head section 31.

Figure 5:
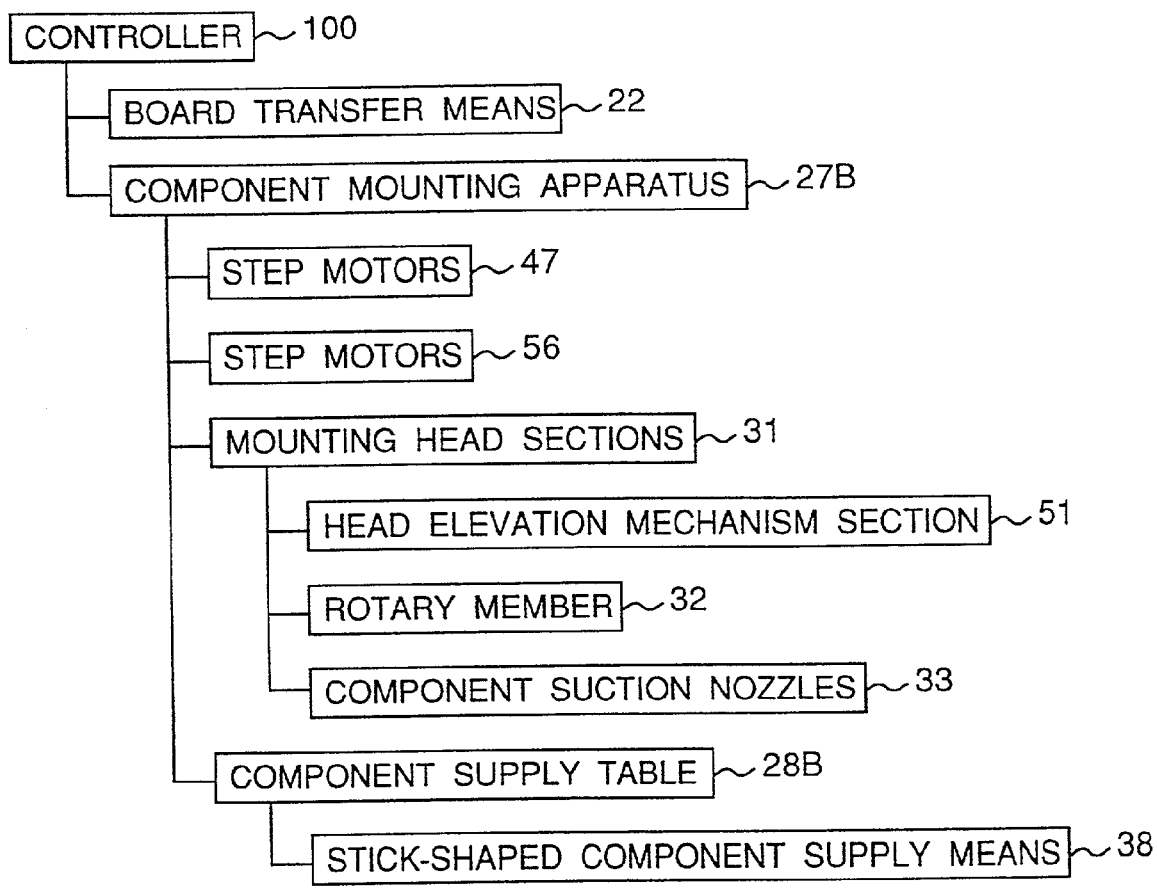
FIG. 5 is a block diagram showing construction for performing the control operation of the apparatus.

Each of the support frames 29 houses therein a head feed mechanism section 52 for moving the head positioning mechanism section 41 via each operating frame 30 in a direction perpendicular to the board transfer path 21. The head feed mechanism section 52 is comprised of a ball thread 54 that is rotatably supported across a pair of support plates 53 fixed to both ends of each support frame 29, a step motor 56 for rotatively driving the ball thread 54 via a connecting means 55, a moving member 57 that is fixed to an end portion of each operating frame 30 as meshed with the ball thread 54 and operates to move the operating frame 30 in accordance with the rotation of the ball thread 54, and a guide shaft 58 that is fixed across the support plates 53 and operates to slidably support the operating frame 30 while allowing the guide shaft 58 to penetrate the other end of the operating frame 30. A controller 200 controls the operations of the apparatuses 27A–27D and the board transfer means 22, because it is connected to them as shown in FIG. 5 in which the connection structure of the apparatus 27B is shown as one example. The other connection structure of the apparatuses 27A, 27C, and 27D are similar to the apparatus 27B.

Figure 4:
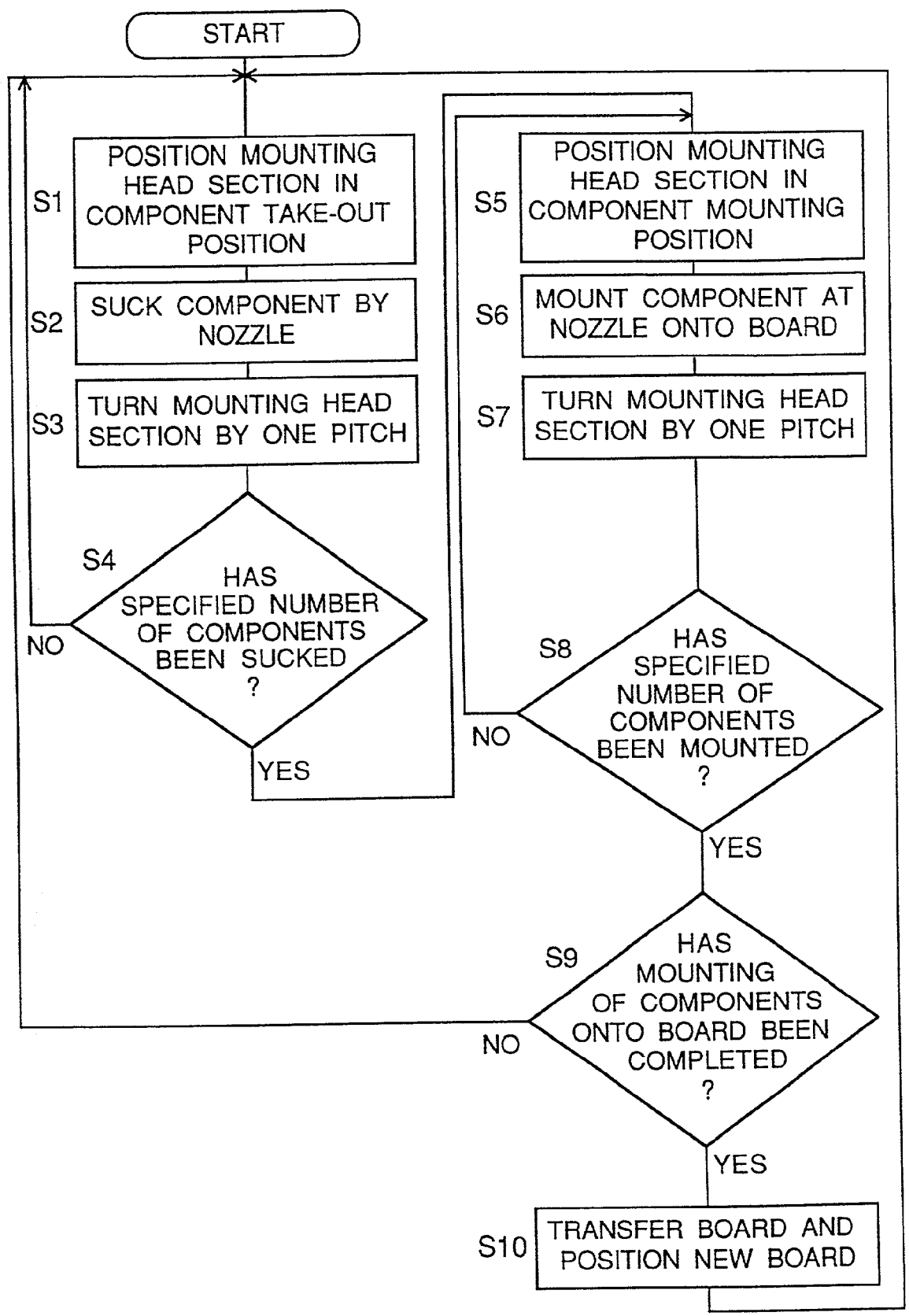
FIG. 4 is a flow chart of the above apparatus.

The operation of the aforementioned component mounting equipment will be described next with reference to a flowchart of FIG. 4. In the component mounting apparatuses 27A through 27D, the mounting head sections 31 are controlled in accordance with a timing at which, while one mounting head section 31 is sucking components 34 from one of the component supply tables 28A through 28D, the other mounting head section 31 mounts the components 34 onto the circuit board 37. Since both the mounting head sections 31 perform an identical operation except for an operating timing shift, only the operation of one mounting head section 31 will be now described.

First, the mounting head section 31 is moved to a position just above the component 34 to be sucked by suction on one of the component supply tables 28A through 28D and then positioned (step S1). That is, upon rotating the step motor 47 of the head positioning mechanism section 41 by a specified angle in the required rotational direction, the moving member 49 moves in the lengthwise direction of the board transfer path 21 by the ball thread 43 that is rotating integrally with the step motor 47, and the mounting head section 31 is moved to a specified component take-out position on the one of the component supply tables 28A through 28D. In this stage, in regard to the other component supply tables 28A through 28C except for the tray-shaped component supply table 28D, the component take-out position is positioned in a straight line extending along the board transfer path 21. Consequently, the mounting head section 31 does not move as positioned in the position until such components as the parts cassette or the stick fronting the mounting head section 31 deplete.

When the mounting head section 31 is positioned, the head elevation mechanism section 51 operates to move down the mounting head section 31, the component suction nozzle 33 sucks a component 34, and thereafter the mounting head section 31 is slightly moved up by the head elevation mechanism section 51 (step S2). Subsequently, the rotary member 32 of the mounting head section 31 is rotated by one pitch, and the next component suction nozzle 33 is made to front the component take-out position (step S3). In this stage, it is decided whether or not the mounting head section 31 has completed the suction of a specified number (four in this embodiment) of components 34 (step S4). If it has not been completed, the same operation as above will be repeated to suck the specified number of components 34.

When the suction of the specified number of components 34 has been completed, the step motor 56 of the head feed mechanism section 52 and the step motor 47 of the head positioning mechanism section 41 are simultaneously driven to move the mounting head section 31 onto the board positioning section 24 via the operating frame 30 in accordance with the rotation of the ball thread 54 and then position it just above a specified component mounting position of the circuit board 37 by the head positioning mechanism section 41 (step S5). Then, the head elevation mechanism section 51 is driven to mount the components that have been held by the component suction nozzle 33 as sucked thereto onto the circuit board 37 (step S6). After the mounting head section 31 is slightly moved up by the head elevation mechanism section 51, the mounting head section 31 is moved to a position just above the next component mounting position of the circuit board 37 and then positioned by the operations of the head positioning mechanism section 41 and the head feed mechanism section 52, and the rotary member 32 is rotated by one pitch, so that the component to be mounted next is made to front the component mounting position (step S7).

In this stage, it is decided whether or not the mounting of all the components 34 that have been held by the mounting head section 31 as sucked thereto has been completed (step S8). If it has not been completed, the same operation as above will be repeated to mount all the components 34 onto the specified positions of the circuit board 37.

When the specified number of components has been completed at step S8, it is decided whether or not the mounting of all the components 34 distributed to the component mounting apparatuses 27A through 27D for the circuit board 37 positioned in the board positioning section 24 has been completed (step S9). If it has not been completed, the mounting head sections 31 are moved again above the component supply tables 28A through 28D to repeat the suction of the components 34 from the component supply tables 28A through 28D and the mounting of the components 34 onto the circuit board 37 in a manner similar to the above until the mounting of all the components 34 onto the circuit board 37 is completed. When the mounting of all the components 34 onto the circuit board 37 is completed, each circuit board 37 positioned in the board transfer path 21 is fed by a specified pitch to be positioned in the board positioning sections 24 of the component mounting apparatuses 27A through 27D for the next process (step S10), and an operation similar to the above will be repeated.

In the above component mounting equipment, mutually different components can be mounted on the component supply tables 28A through 28D of the plurality (four in this embodiment) of component mounting apparatuses 27A through 27D provided in parallel to one another along the board transfer path 21. Therefore, when the types and the number of components 34 to be mounted onto the circuit board 37 increase, these components are mounted on the component supply tables 28A through 28D as distributed into groups classified by type. With this arrangement, since the component supply tables 28A through 28D are mounted with only the components 34 of the respective groups, the tables are not dimensionally increased. Furthermore, since the component supply tables 28A through 28D are installed perpendicularly to the board transfer path 21 at the component mounting apparatuses 27A through 27D, the equipment is not dimensionally increased as a whole without significantly expanding in the direction of the board transfer path 21.

Furthermore, since the mounting head section 31 of the component mounting apparatuses 27A through 27D only operate and the component supply tables 28A through 28D are fixedly installed, the tables become free of vibration regardless of the number of mounted component supply means 12 and 38. Furthermore, the mounting head section 31 sucks at one time a plurality of components 34 from the component supply tables 28A through 28D and successively mounts the components 34 onto the specified portions of the circuit board 37. Furthermore, the component mounting apparatuses 27A through 27D are each provided with a pair of mounting head sections 31 and controls the mounting head sections 31 so that, while one is sucking components 34, the components 34 that are held by the other as sucked thereto are mounted to the circuit board 37. With the above arrangement, even when the types and the number of components 34 to be mounted onto the circuit board 37 increase, the component mounting operation speed can be remarkably increased further than that in the conventional apparatus in which the component supply table is fed at a pitch with respect to the rotary type mounting head section.

When the types of circuit boards 37 increase, it can be coped with only by replacing a part of the component supply tables 28A through 28D installed at the component mounting apparatuses 27A through 27D with component supply tables 28A through 28D mounted with required components 34. It is to be noted that the component mounting apparatuses 27A through 27D can be also used singly.

Second Embodiment

A second embodiment of the present invention will be described below with reference to FIGS. 6 through 16.

Figure 6:
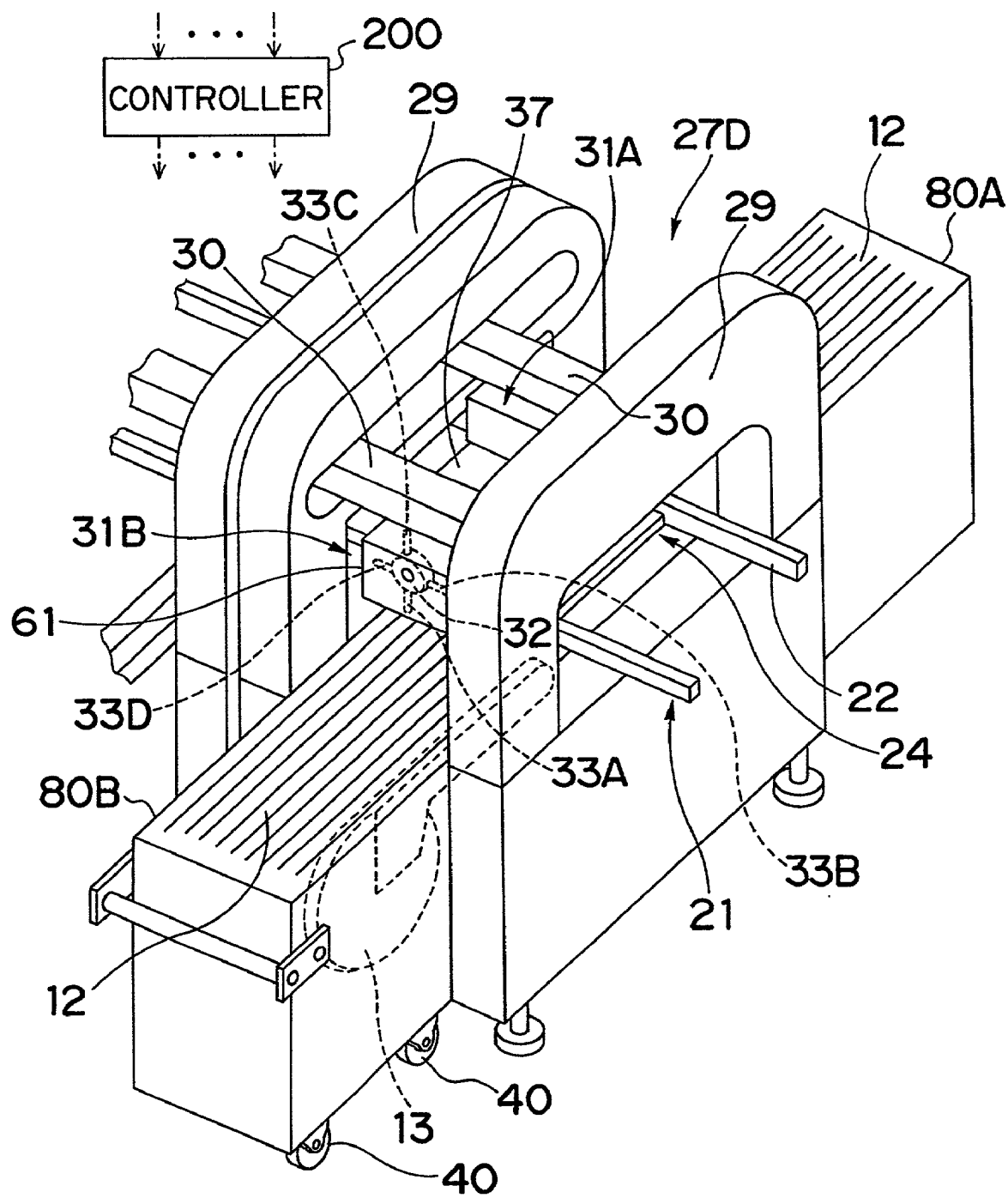
FIG. 6 is a perspective view showing component mounting apparatus according to a second embodiment of the present invention.
Figure 7:
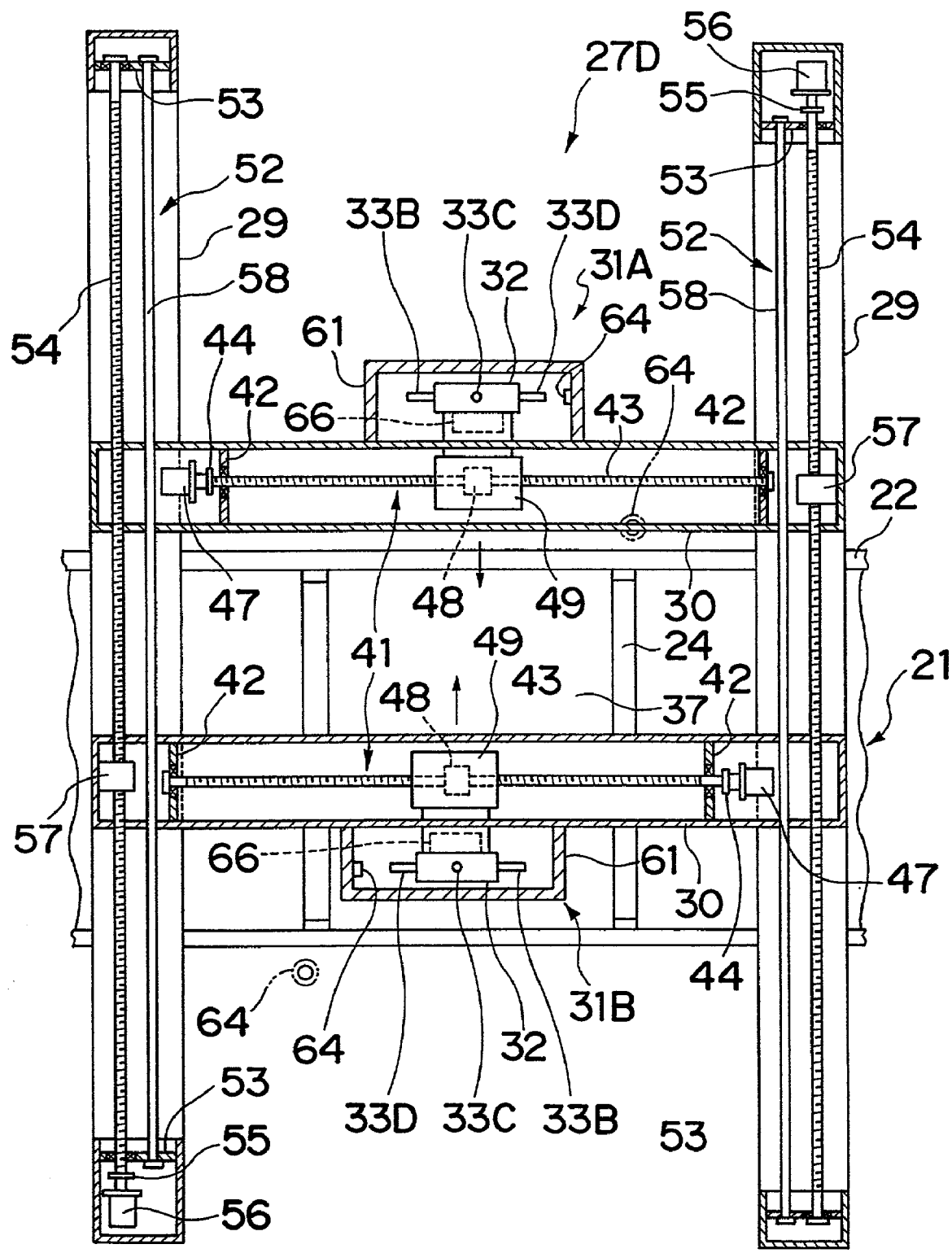
FIG. 7 is a schematic plan view showing the component mounting apparatus according to the second embodiment of the present invention.
Figure 8:
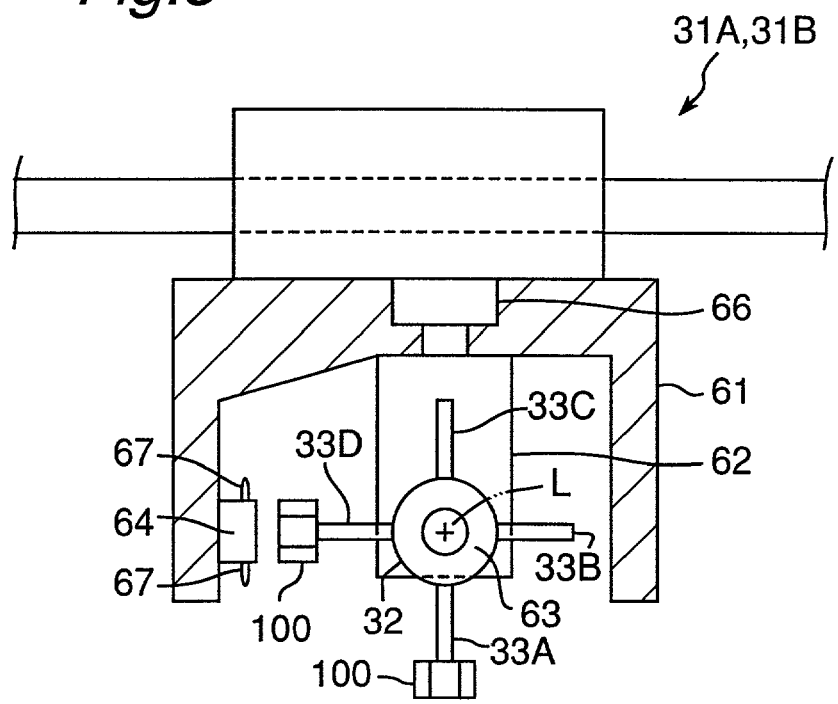
FIG. 8 is a schematic front view showing one example of a mounting head section of the second embodiment.
Figure 9:
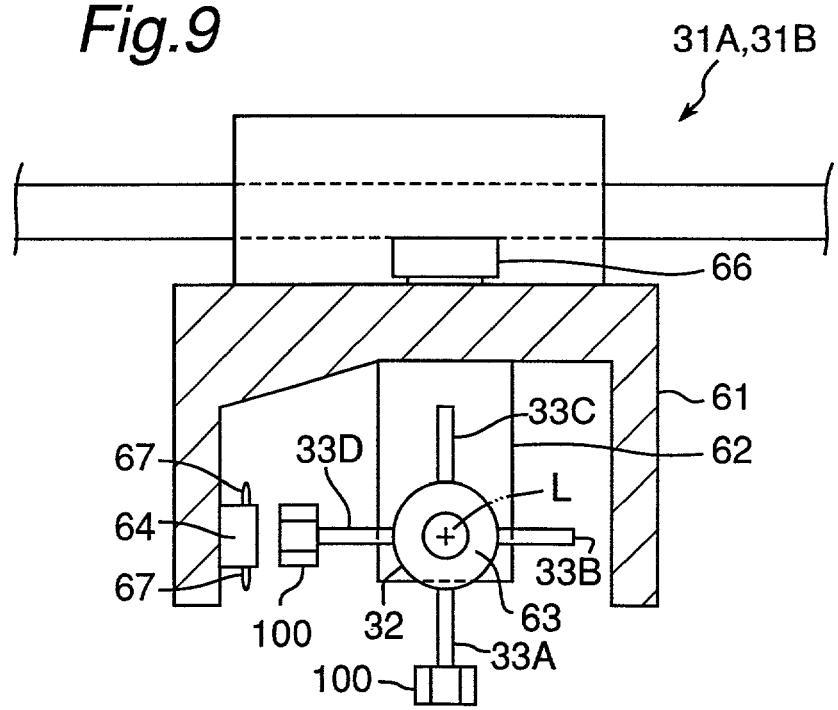
FIG. 9 is a schematic front view showing another example of the mounting head section of the second embodiment.
Figure 10:
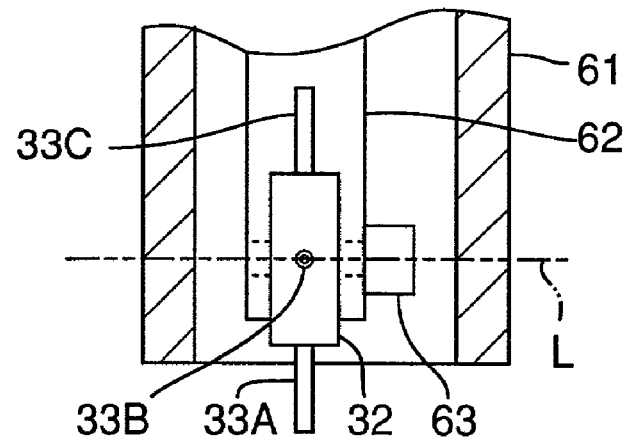
FIG. 10 is a partially enlarged view showing the mounting head section.

In this second embodiment, mounting head sections 1A and 31B of a component mounting apparatus have different structures than those of the first embodiment. Specifically, as shown in FIGS. 6 through 8, each of the mounting head sections 31A and 31B has a hood or frame 61. Held to the frame 61 is a head main body 62 including a rotary member 32 and recognition camera (recognition section) 64. The rotary member 32 is rotatively driven about a lateral or horizontal axis L (refer to FIG. 10) by a head rotating motor 63. Four component suction nozzles 33A, 33B, 33C, and 33D are respectively attached to the rotary member 33 so that they elongate orthogonally intersect the axis L. The head motor 62 is moved upward and downward in a vertical direction with respect to the frame 61 by a head elevation motor 66. As shown in FIG. 9, the head elevation motor 66 may move the frame 61 upward and downward, thereby moving the head main body 62 in the vertical direction.

In this embodiment, the recognition camera 64 is fixed to an inner side of the frame 61 so as to be opposed to one of the component suction nozzles 33A through 33D when the one nozzle is in a horizontal posture. Specifically, as shown in FIG. 8, the recognition camera 64 is arranged so as to be opposed to the component suction nozzle 33B that is positioned at 90 degree with respect to the component suction nozzle 33A in a vertically downward posture or in a position for sucking the component 10. The recognition camera 64 has a field of view directed horizontally. Attached to the recognition camera 64 is an illuminator 67 for illuminating the component 100 that is in a position opposing to the recognition camera 64.

Figure 11:
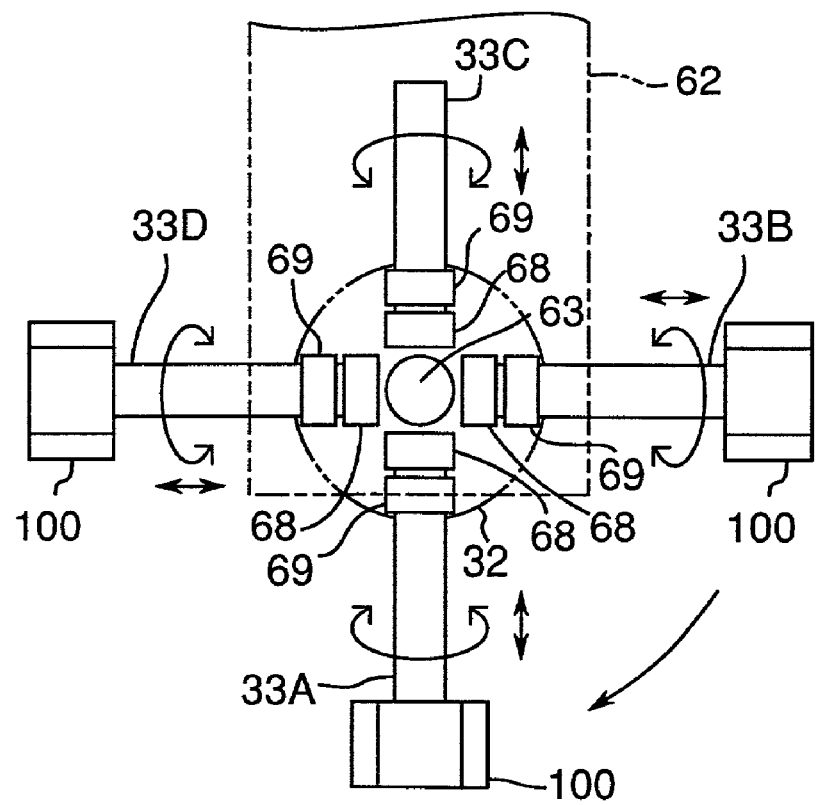
FIG. 11 is a schematic front view showing a rotary member of the mounting head section.

As shown in FIG. 11, four nozzle rotation driving motors 68 are accommodated in the rotary member 32. Each of the nozzle rotation driving motors 68 rotates corresponding component suction nozzle 33A through 33D around an axis thereof with respect to the rotary member 32. Further, four nozzle linear driving motors 69 are accommodated in the rotary member 32. Each of the nozzle linear driving motors 69 moves corresponding component suction nozzles 33A through 33D backward and forward along the axis thereof.

Next, an operation of the component mounting apparatus will be described.

Figure 12:
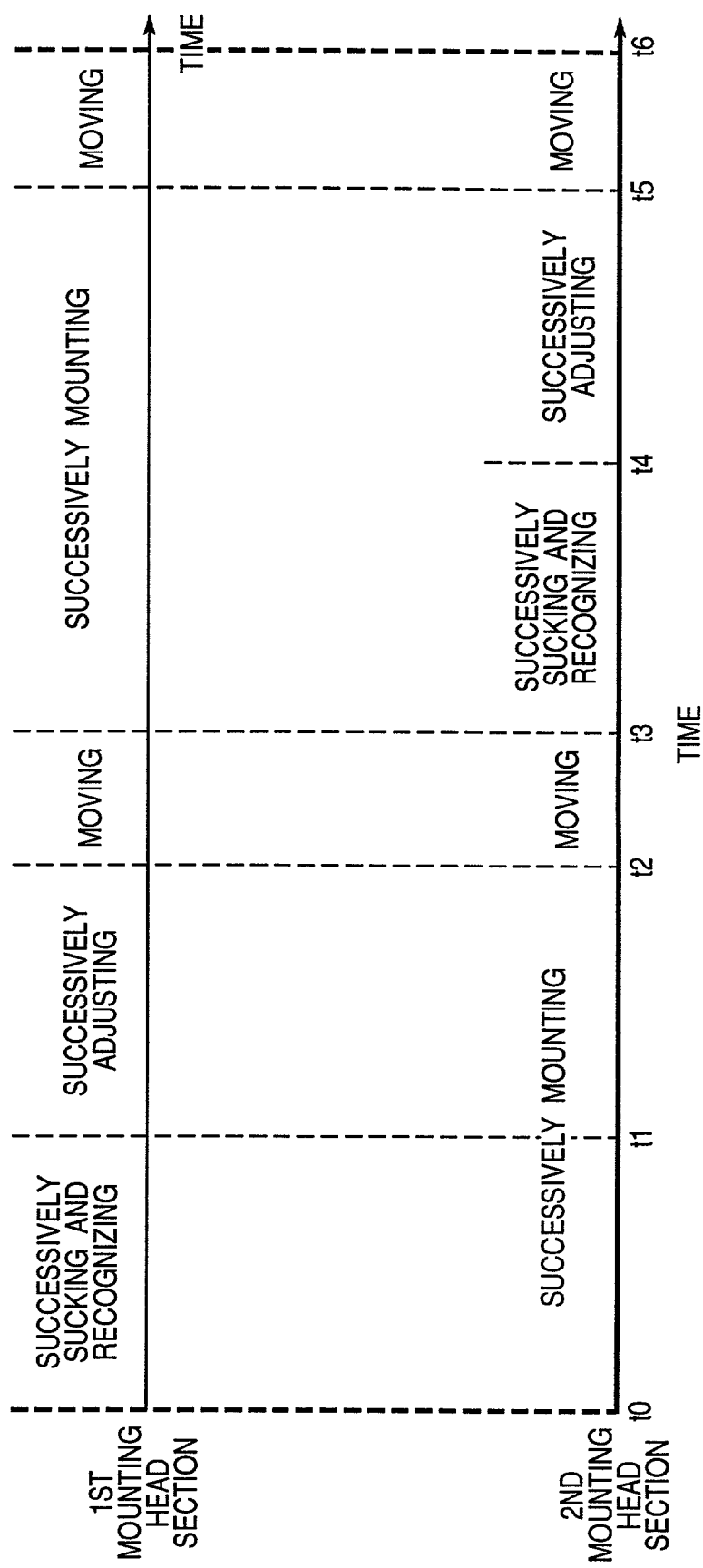
FIG. 12 is a time chart for describing an operation of the component mounting apparatus in the second embodiment.

As shown in FIG. 12, while, of the first and second mounting head sections 31A and 31B, the first mounting head section 31A is successively sucking the components 100 from the corresponding component supply table 80A and recognizing the sucked components 100 (time t0 to time t1), and thereafter adjusting postures of the sucked and recognized components 100 (time t1 to time t2), the second mounting head section 31B successively mounts the adjusted components 100 onto the circuit board positioned at the board positioning section 24 (time t0 to time t2). Contrary to this, while the second mounting head section 31B is successively sucking the components 100 from the corresponding component supply table 80B and recognizing the sucked components 100 (time t3 to time t4), and thereafter adjusting postures of the sucked and recognized components 100 (time t4 to time t5), the first mounting head section 31A successively mounts the adjusted components 100 onto the circuit board 37 positioned at the board positioning section 24 (time t3 to time t5).

The successive suction and recognition of the components 100 will be described below with reference to FIG. 13 and FIGS. 15A through 15D.

Figure 13:
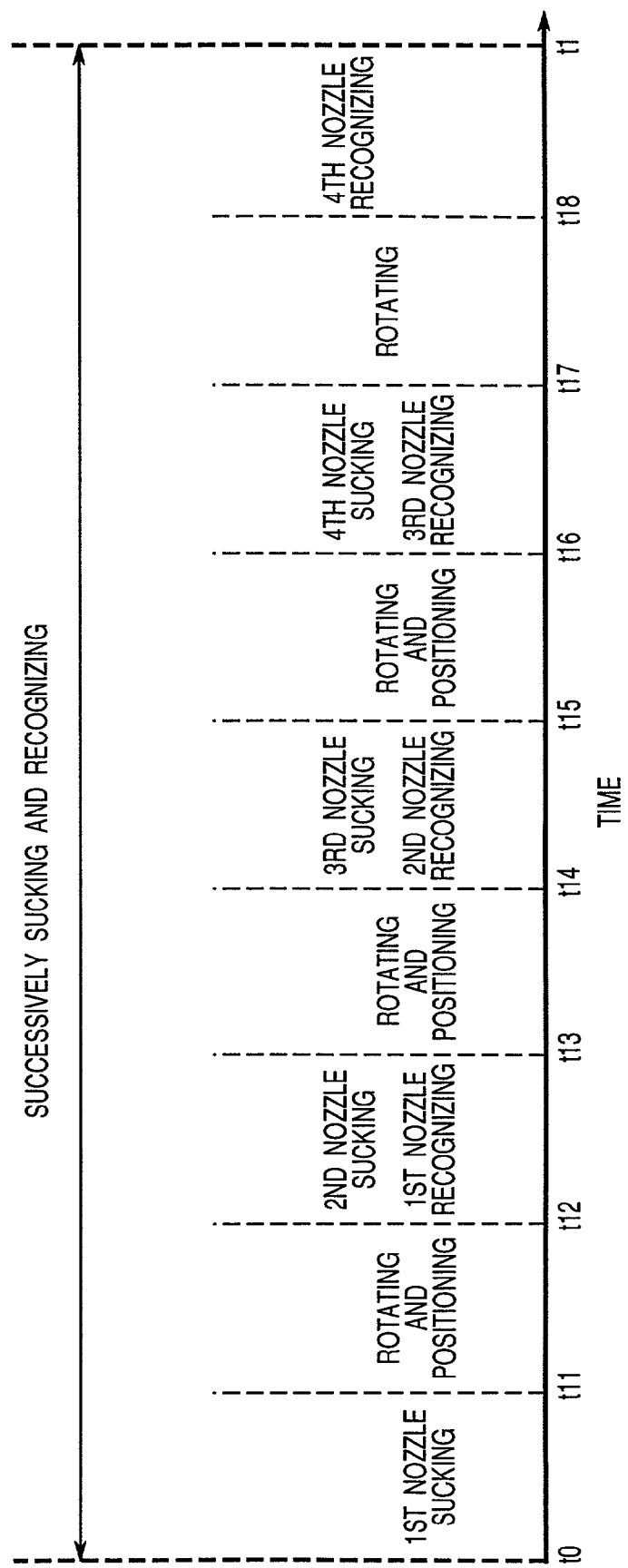
FIG. 13 is a time chart for describing successively sucking and recognizing in the second embodiment.

In this successive suction and recognition of the components 100, suction of the components 100 by the component suction nozzles 33A through 33D and recognition of the components 100 that have been sucked to the component suction nozzles 33A through 33D by the recognition camera 64 are simultaneously or concurrently performed with intermittently rotating the rotary member 32 at a predetermined regular angular interval (90 degree in this embodiment) around the axis L. Specifically, two types of operations are repeated as shown in FIG. 13. These two types of operations include an operation where one of the four component suction nozzles 33A through 33D sucks the component 100 concurrently with recognition of the component 100 that have been sucked to one of remaining component suction nozzles 33A through 33D by the recognition camera 64, and an operation where the rotary member 32 is rotated and the first mounting head section 31A is positioned with respect to one of component supply means 12 on the component supply table 80A.

At the beginning of the successive suction and recognition, the first mounting head section 31A has been moved above the corresponding component supply table 80A by the head positioning mechanism section 41 and the head feed mechanism section 52. Further, the first mounting head section 31A has been positioned at a predetermined level position with respect to the component supply table 80A by the head elevation motor 66.

Figure 15A:
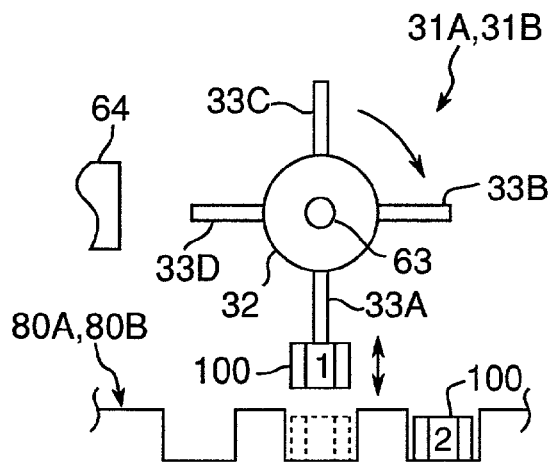
FIGS. 15A through 15D are schematic views for describing operations of the rotary member and nozzles in the successively sucking and recognizing in the second embodiment of the present invention.

First, as shown in FIG. 15A and a time period from time t0 to time t11 of FIG. 13, the first component suction nozzle 33A is projected by the nozzle linear driving motor 69, and thereafter sucks the component 100 to pick up from the component supply table 80A. After the completion of the suction, the component suction nozzle 33A is moved backward by the nozzle linear driving motor 69.

Next, as shown in a time period from t11 to t12 in FIG. 13, the rotary member 32 is rotated by an angle of 90 degree in a clockwise direction in the figures by the head rotating motor 63 and the first mounting head section 31A is positioned with respect to one of the component supply means 12 by the head positioning mechanism section 41.

Figure 15B:
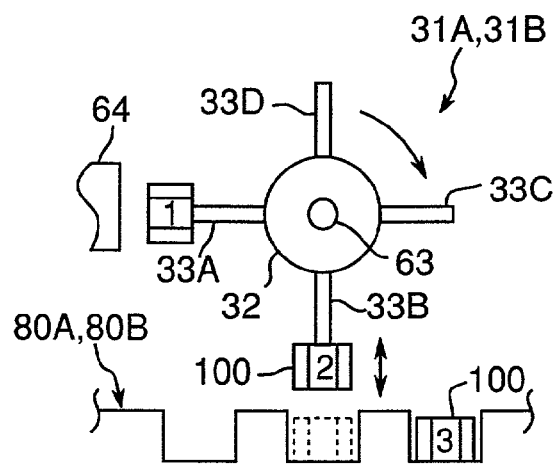

As shown in FIG. 15B, the rotation of the rotary member 32 results in that second component suction nozzle 33B is directed downward in the vertical direction. Further, the rotation of the rotary member 32 results in that the first component suction nozzle 33A to which the component 100 has been sucked is directed horizontally. In this state, the second component suction nozzle 33B projects, and thereafter sucks the component 100 to pick up from the component supply table 80A. Concurrently with the suction of the component 100, the recognition camera 64 recognizes the component 100 sucked to the first component suction nozzle 33A (time t12 to time t13).

Figure 15C:
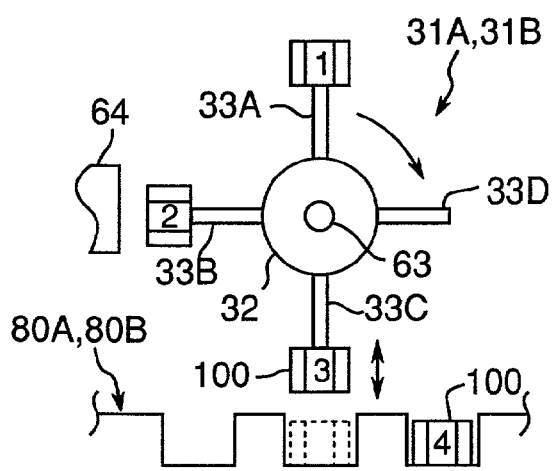
Figure 15D:
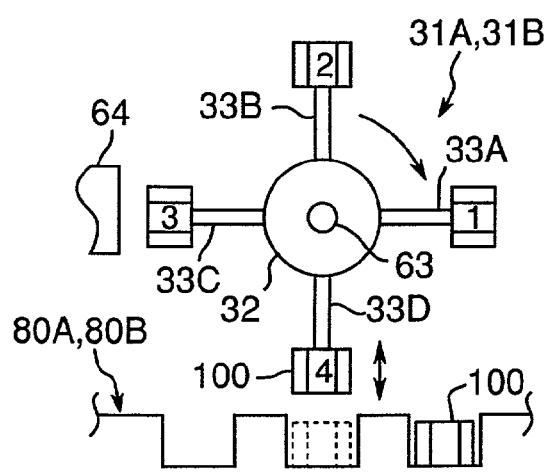

Next, as shown in a time period from time t13 to time t14 in FIG. 13, the rotary member 32 is rotated by the angle of 90 degree and the first mounting head section 31A is positioned. As shown in FIG. 15C, the rotation of the rotary member 32 results in that third component suction nozzle 33C is directed downward in the vertical direction and the second component suction nozzle 33C which has sucked the component 100 is directed horizontally. While the rotary member 32 is at this angular position, the third component suction nozzle 33C sucks the component 100 to pick up from the component supply table 80A and the recognition camera 64 concurrently recognizes the component 100 that has been sucked the second component suction nozzle 33B (time t14 to time t15 in FIG. 13).

Next, as shown in a time period from time t15 to time t16, the rotary member 32 is rotated by the angle of 90 degree and the first mounting head section 31A is positioned. Then, while the rotary member 32 is at the angular position shown in FIG. 15D, the fourth component suction nozzle 32D sucks the component 100 to pick up from the component supply table 80A and the recognition camera 64 concurrently recognizes the component 100 that has been sucked to the third component suction nozzle 33C (time 16 to time t17 in FIG. 13).

After completion of further rotation of the rotary member 32 at 90 degree (time t17 to time t18), the recognition camera 64 recognizes the component 100 that has been sucked to the fourth component suction nozzle 33D (time t18 to time t1).

Then, in the successive adjustment of the postures shown in a time period from time t1 to time t2 in FIG. 12, each of the component suction nozzles 33A through 33D is rotated around the axis thereof at respective angles corresponding to a recognition result of each component 100 that has been sucked to the component suction nozzles 33A through 33D from the recognition camera 64 (refer to FIG. 11). As the result, the postures of all components 100 respectively sucked by component suction nozzles 33A through 33D are adjusted. The nozzle rotation driving motor 68 for the component suction nozzles 33A through 33D may be activated at once, or may be activated sequentially by each of them or by ones of them.

After the suction of the components 100 by all of the four nozzles 33A through 33D, the recognition of the components 100, and the completion of posture adjustment of these components 100, the first mounting head section 31A is moved by the head positioning mechanism section 41 and the head feed mechanism section 52 above the circuit board 37 positioned at the board positioning section 24 (time t2 to time t3 in FIG. 12). The successive adjustment of the postures of the components 100 may be performed while the first mounting head section is moving toward the board positioning section 24.

Next, the successive mounting of the components 100 during the time period from time t3 to time t5 in FIG. 12 will be described below.

In this successive mounting of the components 100, the components 100 that have been sucked to the component suction nozzles 33A through 33D are successively mounted onto the circuit board 37 with intermittently rotating the rotary member 32 about the axis L at a predetermined regular angular interval (90 degree in this embodiment).

Figure 14:
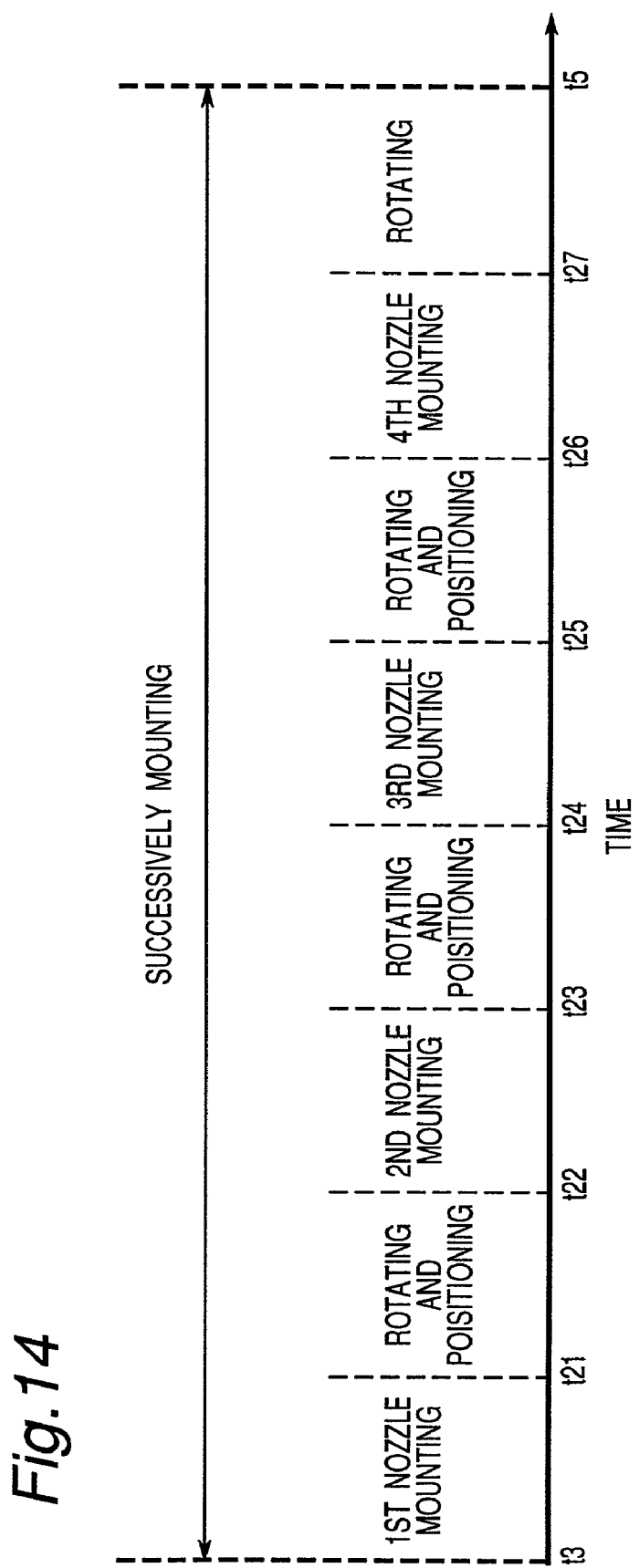
FIG. 14 is a time chart for describing successively mounting in the second embodiment.

Specifically, as shown FIG. 14, two types of operations are repeated. These two types of operations include an operation where the component 100 sucked to one of the four component suction nozzles 33A through 33D is mounted onto the circuit board 37, and an operation where the rotary member 32 is rotated and first mounting head section 31A is positioned with respect to a predetermined position of the circuit board 37.

Figure 16A:
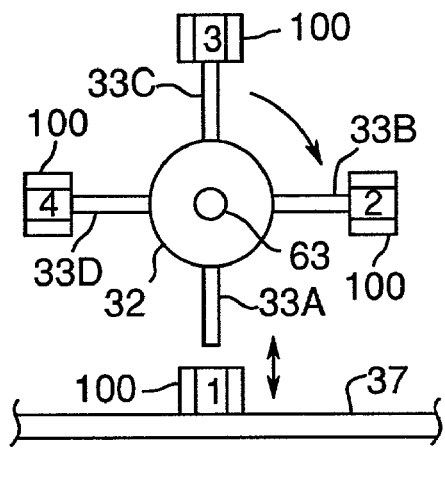
FIGS. 16A through 16D are schematic views for describing operations of the rotary member and the component suction nozzles in the successively mounting in the second embodiment of the present invention.

At the beginning of the successively mounting, as shown in FIG. 16A and a time period from time t3 to time t21 of FIG. 14, the first component suction nozzle 33A is projected by the nozzle linear driving motor 69 to mount the component 100 onto the circuit board 37. Thereafter, the first component nozzle 33A is moved backward by the nozzle linear driving motor 69.

Figure 16B:
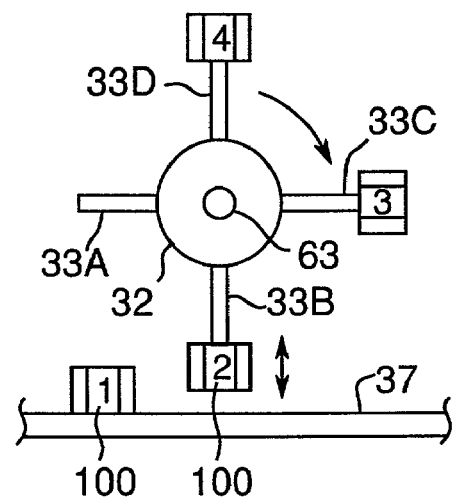

Next, as shown in a time period from time t21 to time t22, the rotary member 32 is rotated at 90 degree in the clockwise direction by the head rotating motor 63 and the first mounting head section 31A is positioned with respect to another position of the circuit board 37 by the head positioning mechanism section 41 and the head feed mechanism section 52. As shown in FIG. 16B, the rotation of the rotary member 32 results in that the second component suction nozzle 33B is directed downward in the vertical direction. In this state, the second component suction nozzle 33B is projected to mount the component 100 onto the circuit board 37 (time t22 to time t23 in FIG. 14).

Figure 16C:
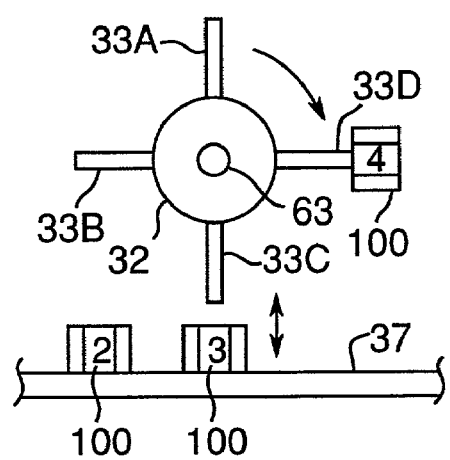

Next, as shown in a time period from time 23 to time t24 in FGI. 14, the rotary member 32 is rotated at 90 degree in the clockwise direction and the first mounting head section 31A is positioned with respect to a further next position of the circuit board 37. As shown in FIG. 16C, the rotation of the rotary member 32 results in that the third component suction nozzle 33C is directed downward in the vertical direction. In this state, the third component section nozzle 33C is projected to mount the component 100 onto the circuit board 37 (time t24 to time t25 in FIG. 14).

Figure 16D:
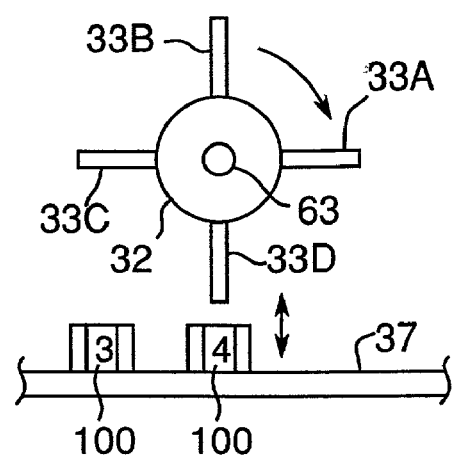

Similarly, after further rotation of the rotary member 32 and positioning of the first mounting head section 31A (time t25 to time t26), the fourth component suction nozzle 33D is projected to mount the component 100 onto the circuit board 37 as shown in FIG. 16D.

After all components 100 sucked to the four component suction nozzles 33A through 33D have been mounted on the circuit board 37 as described above, the first mounting head section 31A is moved toward the corresponding component supply table 80A by the head positioning mechanism section 41 and the head feed mechanism section 52 (time t5 to time t6 in FIG. 12).

The successive suction and recognition of the components 100 by the second mounting head section 31B (time t3 to time t4 in FIG. 12), successive posture adjustment of the components 100 by the second mounting head section 31B (time t4 to time t5 in FIG. 12) are respectively same as those by the first mounting head section 31A. The successive mount of the components 100 by the second mounting head section 31B (time period from time t0 to time t2 in FIG. 12) is also same as that by the first mounting head section 31A. The other construction and function of the second embodiment are the same as those of the first embodiment described above. Therefore, the same elements are denoted by the same reference numerals, and the description thereof is omitted.

Third Embodiment

Next, a third embodiment of the present invention will be described with reference to FIGS. 17 through 20.

Figure 17:
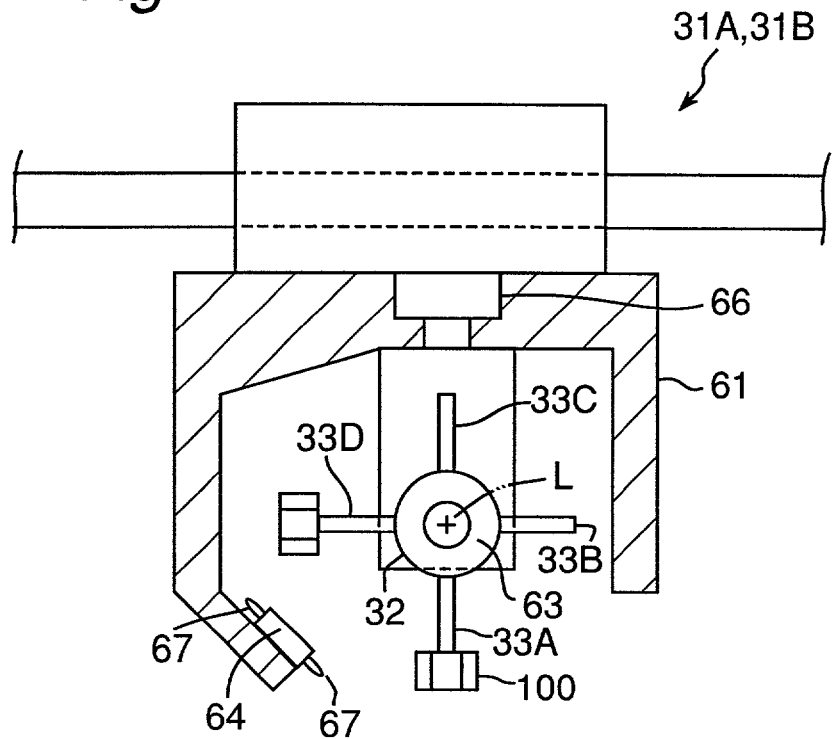
FIG. 17 is a schematic front view showing one example of a mounting head section according to a third embodiment of the present invention.
Figure 18:
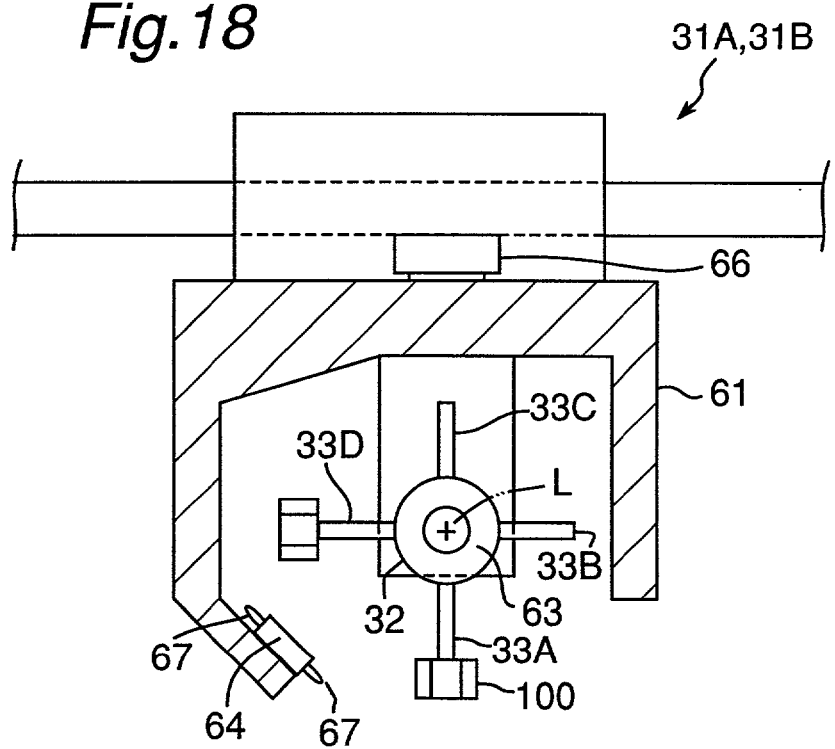
FIG. 18 is a schematic front view showing another example of the mounting head section according to the third embodiment of the present invention.

In the third embodiment, a fixing position of the recognition camera 64 to the frame 61 and a field of view thereof are different from those in the second embodiment. Specifically, as shown in FIG. 17, the recognition camera 64 is positioned with respect to the component suction nozzle 33A directed downward in the vertical direction, which is in the position where the suction of the component 100 is to be performed, at an angular position of 45 degree in the clockwise direction. Further, the field of view of the recognition camera 64 is directed so as to form an angle of 45 degree with respect to the horizontal direction in FIG. 17. The fixing position and the field of view of the recognition camera 64 allow that the components 100 sucked to the component suction nozzles 33A through 33D pass across the filed of view of the recognition camera 64 while corresponding component suction nozzles 33A through 33D are changed in their posture from vertically downward directions to horizontal directions. During passing across the filed of view of the recognition camera 64, the components 100 are recognized by the recognition camera 64.

The head main body 62 may be moved up and down with respect to the frame 61 by the head elevation motor 66 as shown in FIG. 17, or the frame 61 may be moved up and down by the head elevation motor 66 thereby moving the head main body 62 up and down.

Next, the operation of the component mounting apparatus according to the third embodiment will be described.

The operation of the third embodiment is similar with that of the second embodiment shown in FIG. 12 as a whole. In other words, the first mounting head section 31A repeatedly performs the successive suction and recognition of the components 100 (time t0 to time t1 in FIG. 12), the successive adjustment of the postures of the components 100 (time t1 to time t2 in FIG. 12), the moving from the component supply table 80A to the board positioning section 24 (time t2 to time t3 in FIG. 12), the successive mounting of the components 100 (time t3 to time t5 in FIG. 12), and the moving from the board positioning section 24 to the component supply table 80A (time t5 to time t6 in FIG. 12). The second mounting head section 31B performs the successive mounting of the components 100 during the successive suction and recognition of the components 100 of the first mounting head section 31A (time t0 to time t2 in FIG. 12). Further, during the successive mounting of the components 100 by the mounting head section 31A, the second mounting head section 31B performs the successive suction and recognition of the components 100 (time t3 to time t4 in FIG. 12) and the successive adjustment of the postures of the components 100 (time t4 to time t5).

However, the operation of the third embodiment is different from that of the second embodiment in the successive suction and recognition. The successive suction and recognition in the third embodiment will be described below in taken in conjunction with the first mounting head section 31A.

Figure 20A:
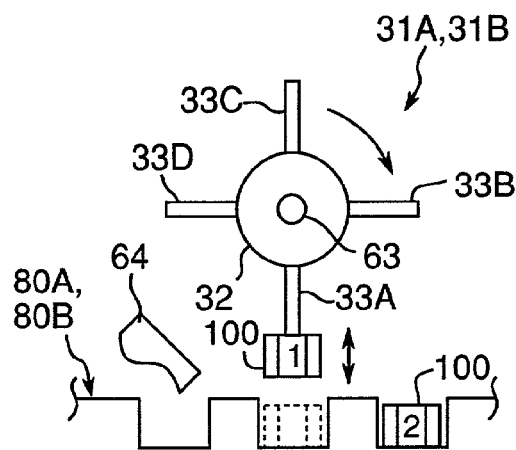
FIGS. 20A through 20H are schematic front views for describing operations of the rotary member and the component suction nozzles in the successively sucking and recognizing in the third embodiment of the present invention.

First, as shown in FIG. 20A and a time period from time t0 to time t31 in FIG. 19, the first component suction nozzle 33A is projected by the nozzle linear driving motor 69 (refer to FIG. 11), and thereafter sucks the component 100 to pick up from the corresponding component supply table 80. After completion of the suction, the component suction nozzle 33A is moved backward by the nozzle linear driving motor 69.

Figure 20B:
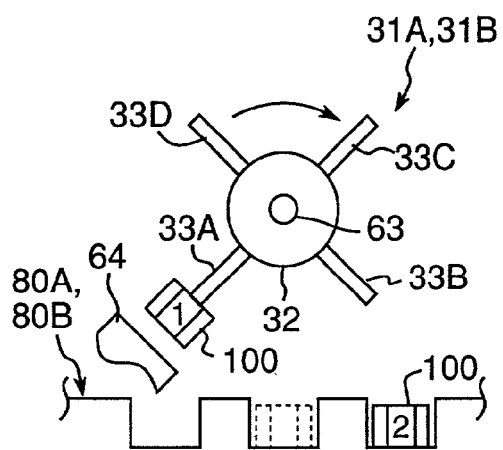
Figure 20C:
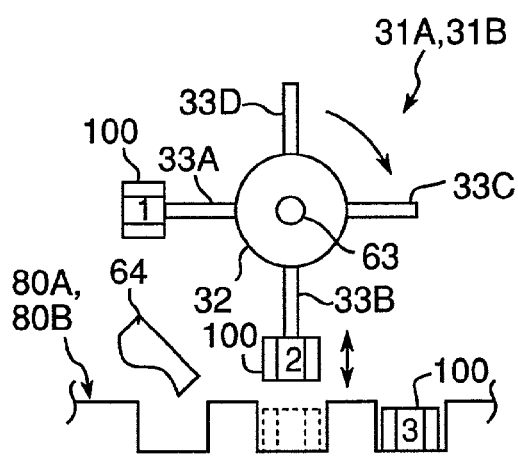

Next, as shown in FIG. 20B and a time period from t31 to t32 in FIG. 19, the rotary member 32 is rotated by an angle of 90 degree in the clockwise direction in the figures by the head rotating motor 63. During this rotation of the rotary member 32, the component 100 that has been sucked to the first component suction 33A is passed across the field of view of the recognition camera 64 and recognized by the recognition camera 64. At the moment when the rotation of the rotary member 32 is completed as shown in FIG. 20C, the posture of the second component suction nozzle 33B is directed downward in the vertical direction. Further, after the completion of the rotary member 32, the first mounting head section 31A is positioned with respect to one of the component supply means 12 by the head positioning mechanism section 41 (time t32 to t33 in FIG. 19).

Figure 20D:
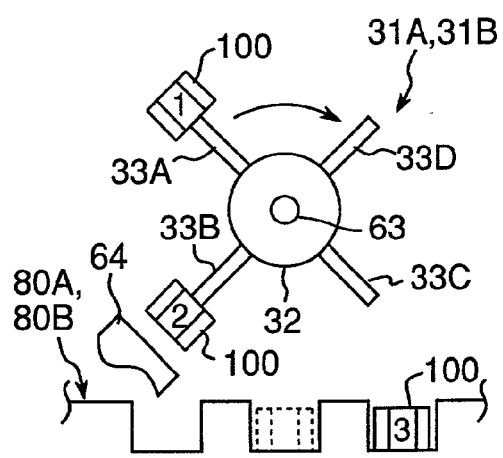
Figure 20E:
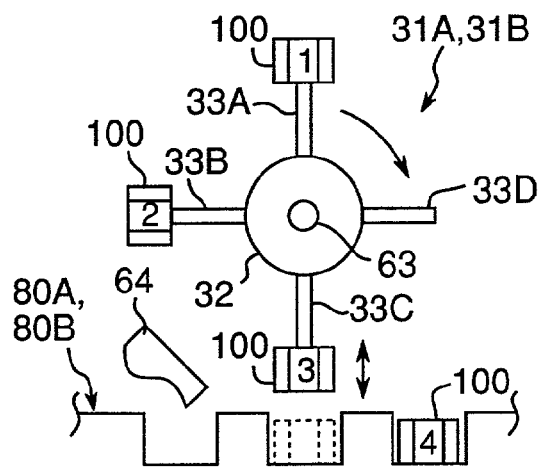
Figure 20F:
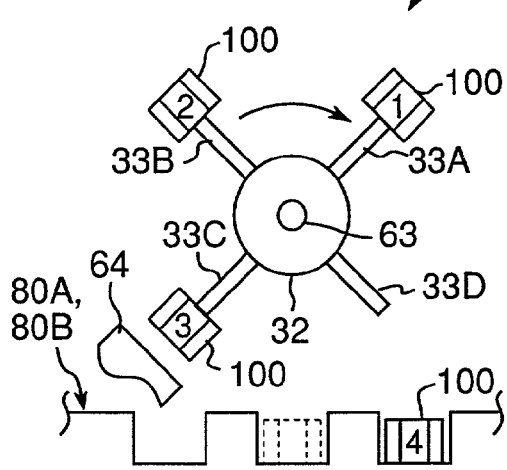
Figure 20G:
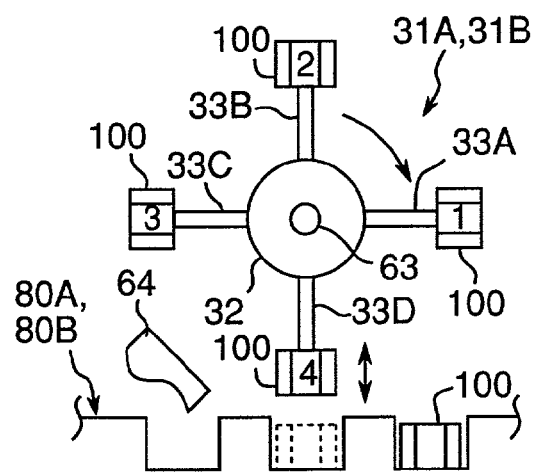
Figure 20H:
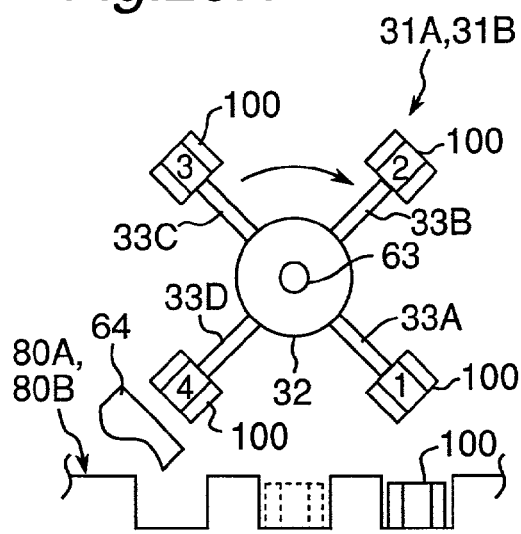

Next, as shown in FIG. 20C and a time period from t33 to t34 in FIG. 19, the second component suction nozzle 33B sucks the component 100 to pick up. After that, as shown in FIG. 20D and a time period from time t34 to time t35 in FIG. 19, the rotary member 32 is rotated by an angle of 90 degree in the clockwise in the figures. Further, during the rotation of the rotary member 32, the component 100 sucked to the second component suction nozzle 33B is passed across the field of view of the recognition camera 64 and recognized by the recognition camera 64. When the rotation of the rotary member 32 is completed as shown in FIG. 20E, third component suction nozzle 33C is directed downward in the vertical direction. Further, after completion of the rotation of the rotary member 32, the first mounting head section 31A is positioned with respect to the one of the component supply means 12 (time t35 to time t36 in FIG. 19).

Subsequently, the recognition of the component 100 sucked to the third component suction nozzle 33C by the recognition camera 64 while the rotary member 32 is rotating (FIG. 20F and time period from time t37 to time t38 in FIG. 19), the positioning of the first mounting head section 31A (time period from time t38 to time t39 in FIG. 19), suction of the component 100 by the fourth component suction nozzle 33D (FIG. 20G and a time period from time t39 to time 40 in FIG. 19), and the recognition of the component 100 sucked to the fourth component suction nozzle 33D by the recognition camera 64 (FIG. 20H and a time period from time t40 to time t1) are performed.

The other construction and function of the third embodiment are the same as those of the second embodiment described above. Therefore, the same elements are denoted by the same reference numerals, and the description thereof is omitted.

Fourth Embodiment

A fourth embodiment of the present invention will be described below with reference to the FIGS. 21 through 24.

In the second and third embodiments described above, the recognition cameras 64 are attached to the frame 61 of the first and second mounting head sections 31A and 31B, and therefore moved together with the component suction nozzles 33A through 33D. In contrast to this, in this fourth embodiment, as schematically shown in FIG. 7, two recognition cameras 64 respectively corresponding to the first and second mounting head sections 31A and 31B are arranged not to the frame 61 but near the board positioning section 24. Further, the filed of views of these recognition cameras 64 are directed upward in the vertical direction.

An operation of the component mounting apparatus of the fourth embodiment will be described below.

As shown in FIG. 21, the first mounting head section 31A repeatedly performs the successive suction of the components 100 at the component supply table 80A (time t50 to time t51), the moving from the component supply table 80A to above the recognition camera 64 (time t51 to t52), the successive recognition of the components 100 by the recognition camera 64 (time t52 to time t53), the successive adjustment postures of the components 100 (time t53 to time t54), the moving from above the recognition camera 64 to the board positioning section 24 (time t54 to time t55), the successive mount of the components 100 (time t55 to time t59), and the moving from the board positioning section 24 to the component supply table 80A (time 59 to time t60). Further, the second mounting head section 31B performs the successive mount of the components 100 while the first head section 31A performs the successive suction, recognition, and adjustment (time t50 to time t54). The second mounting head section 31B performs the successive suction (time t55 to time t56), the successive recognition (time t57 to time t58), and the successive adjustment of postures (time t58 to time t59) while the first mounting head section 31A performs the successive mount of the components 100.

Figure 23:
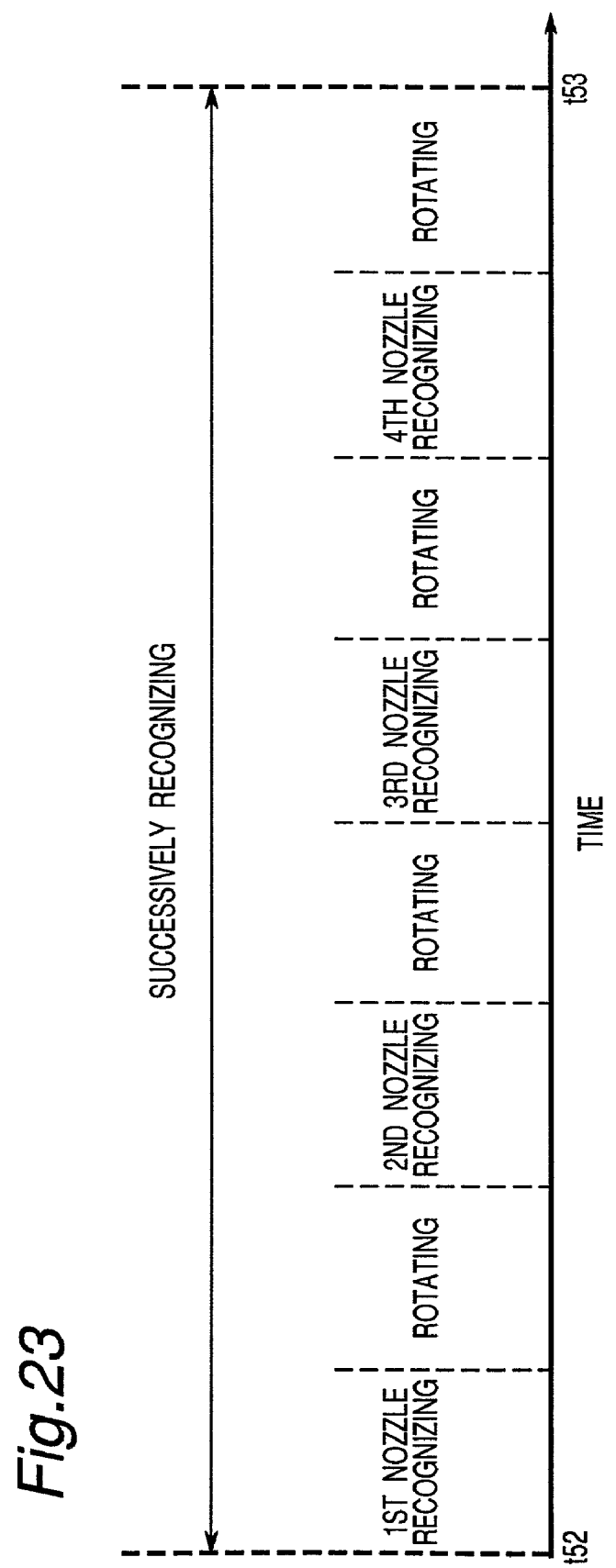
FIG. 23 is a time chart for describing successively recognizing in the fourth embodiment.
Figure 24A:
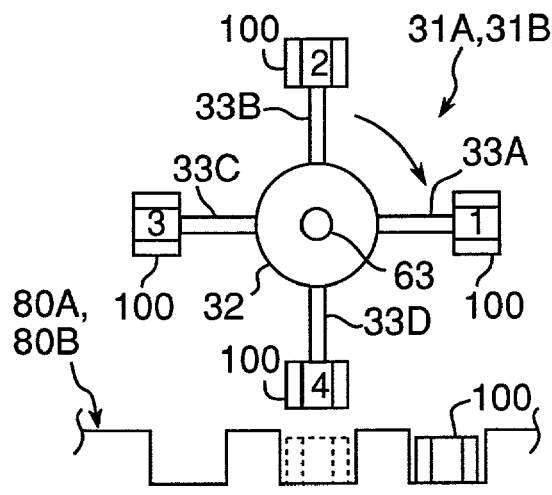
FIGS. 24A through 24D are schematic front views for describing operations of the rotary member and the component suction nozzles in the fourth embodiment of the present invention.
Figure 24B:
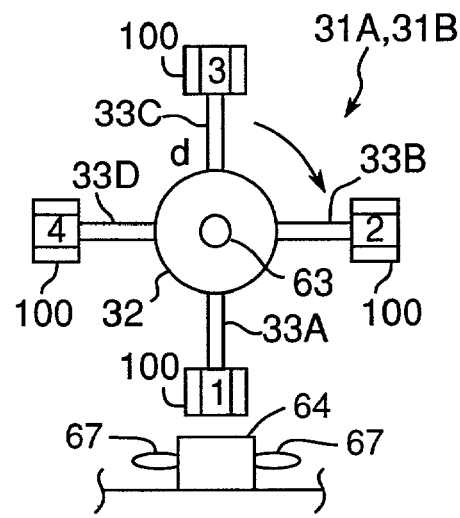
Figure 24C:
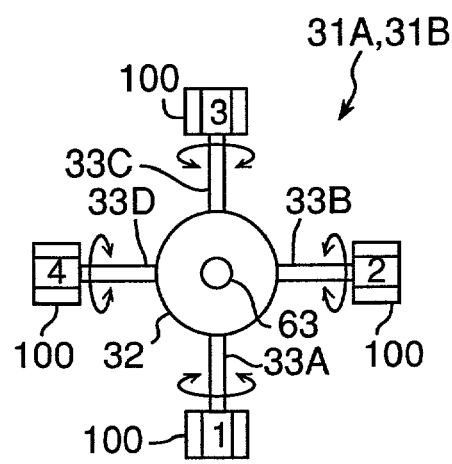

Next, the successive suction, recognition, adjustment, and mounting in the fourth embodiment will be described below in taken in conjunction with the first mounting head section 31A. As shown FIGS. 22 and 24A, the successive suction is performed by repetition of suction of the component 100 by one of the component suction nozzles 33A through 33D, rotation of the rotary member 32, and positioning of the first mounting head section 31A concurrently with the rotation of the rotary member 32. As shown in FIGS. 23 and 24B, the successive recognition is performed by repetition of the recognition of the component 100 sucked to one of the component suction nozzles 33A through 33D and the rotation of the rotary member 32. As shown in FIG. 24C, the successive adjustments of postures of the components 100 is performed by rotating the component suction nozzles 33A through 33D around axes thereof according to the recognition results by the recognition camera 64.

Figure 24D:
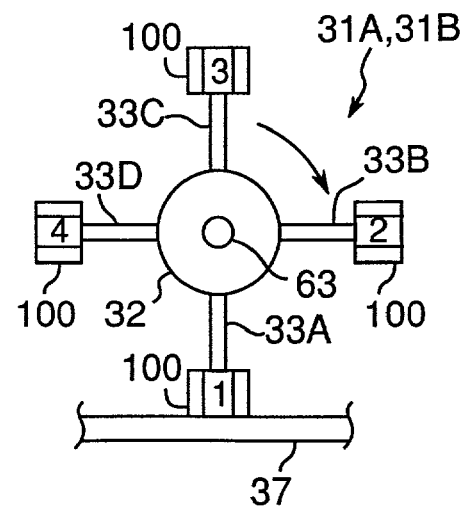

As shown in FIGS. 24D and 14, the successive mounting of the components 100 is performed by repetition of the mounting of the component 100 sucked to one of the component suction nozzles 33A through 33D onto the circuit board 37, the rotation of the rotary member 32, and the positioning of the first mounting head section 31A.

The other construction and function of the fourth embodiment are the same as those of the first embodiment described above. Therefore, the same elements are denoted by the same reference numerals, and the description thereof is omitted.

Figure 25:
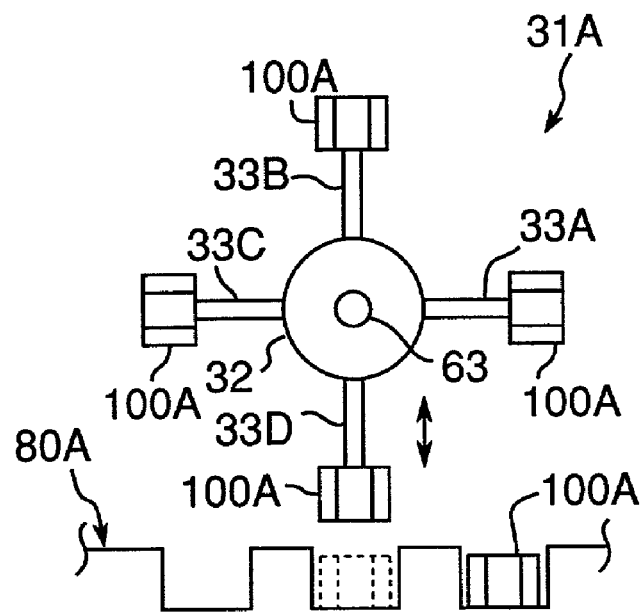
FIG. 25 is a schematic front view showing a mounting head section designed specifically for small components.
Figure 26:
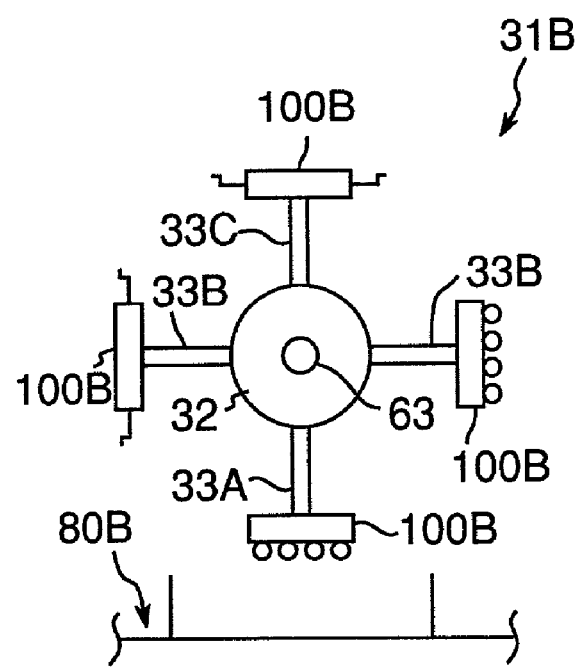
FIG. 26 is a schematic front view showing a mounting head section designed specifically for large components.
Figure 27A:
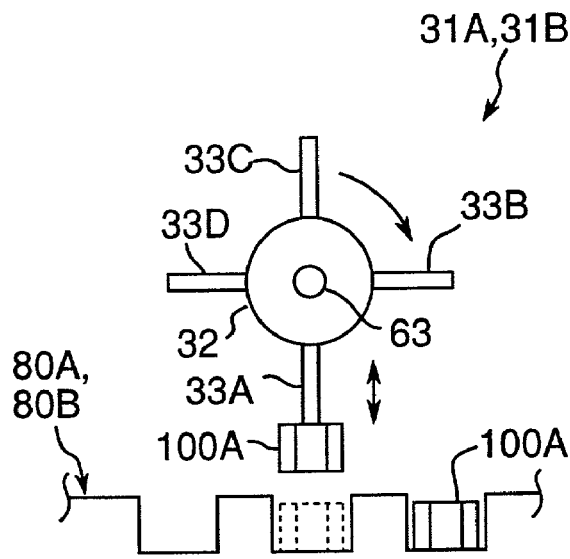
FIGS. 27A through 27D are schematic views for describing a preferable order of sucking to pick-up where one mounting head section sucks a plurality of types of components.
Figure 27B:
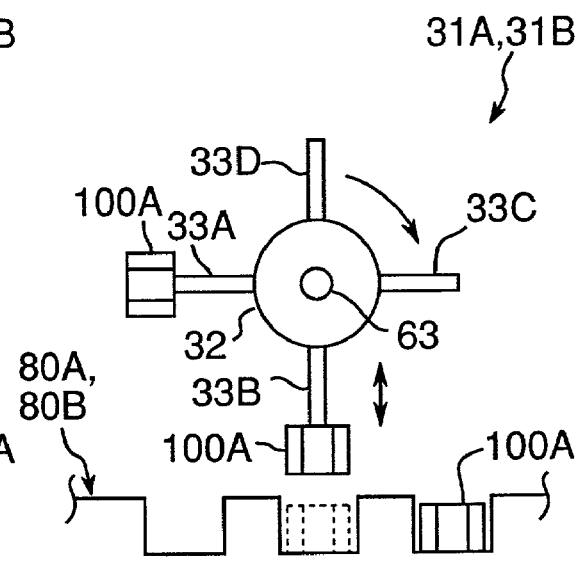
Figure 27C:
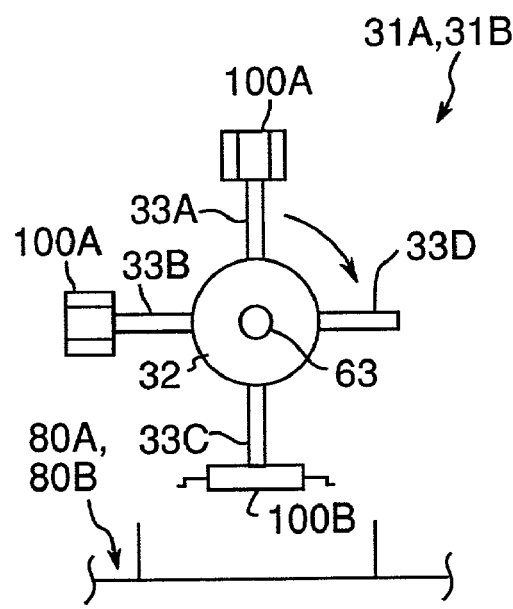
Figure 27D:
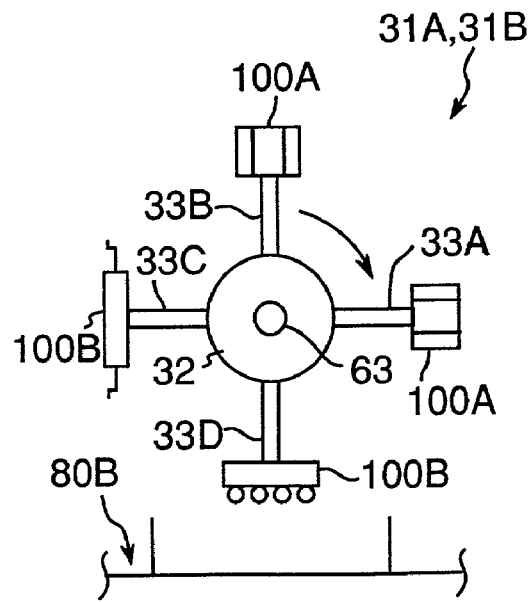
Figure 28A:
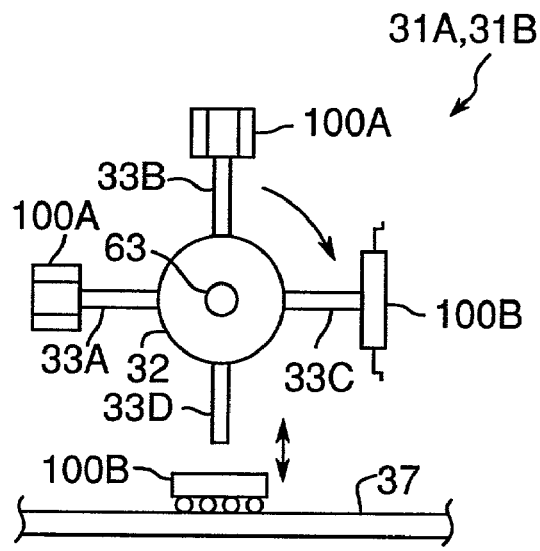
FIGS. 28A through 28D are schematic front views for describing a preferable order of mounting where one mounting head section mounts a plurality of types of components.
Figure 28B:
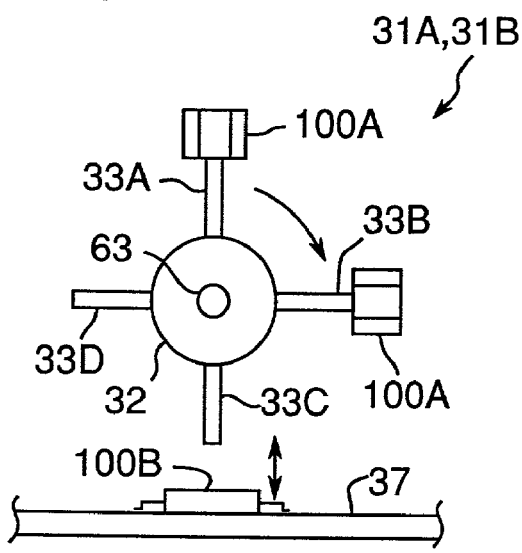
Figure 28C:
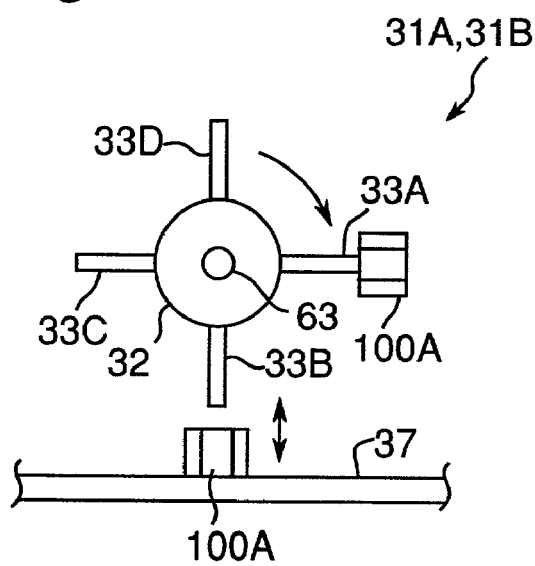
Figure 28D:
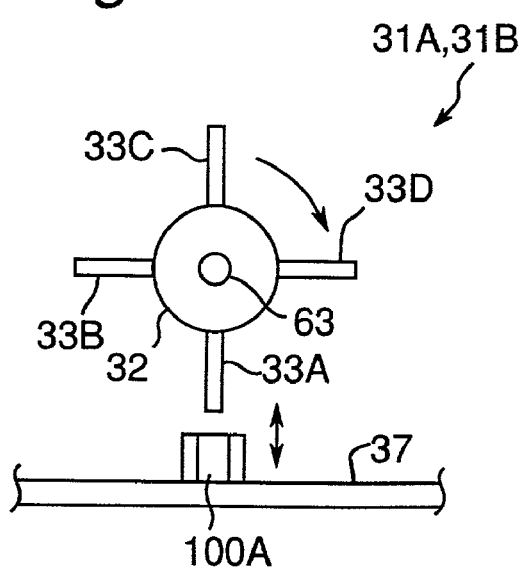

One of the first and second mounting head sections (e.g. the first mounting head section 31A) may be designed specifically for components 100A as shown in FIG. 25 that are smaller in size and can be mounted at high speed, whereas the other of them (the second mounting head section 31B) may be designed for components 100B as shown in FIG. 26 that are larger in size and require a high degree of precision in mounting.

In case that different types of components, namely both of relatively small and large components, are sucked and mounted by same one of mounting head sections 31A and 31B, it is preferable that the suction and the mount of the components are performed in accordance with following order. First, in the successive suction of the different types of components, as shown in FIGS. 27A through 27D, it is preferable that the smaller components 100A are sucked in advance, and thereafter the larger components 100B are sucked. This is because that if the larger components 100B are sucked in advance, then the inertial force acting on the rotary member 32 is increased resulting in that reduction in accuracy of the angular position of the rotary member 32 generates erroneousness in positions of the component suction nozzles 33A through 33D. Contrary to this, in successive mount of the different types of components, as shown in FIGS. 28A through 28D, it is preferable that the larger components 100B are mounted in advance and thereafter the smaller components 100A are mounted. This is because that precedent mounting of the larger components 100B decreases the inertial force acting on the rotary member 32 during subsequent rotation, resulting in that improvement of the accuracy of the rotary angular position of the rotary member 32 enhances the accuracy in positioning of the component suction nozzles 33A through 33D.

Figure 29:
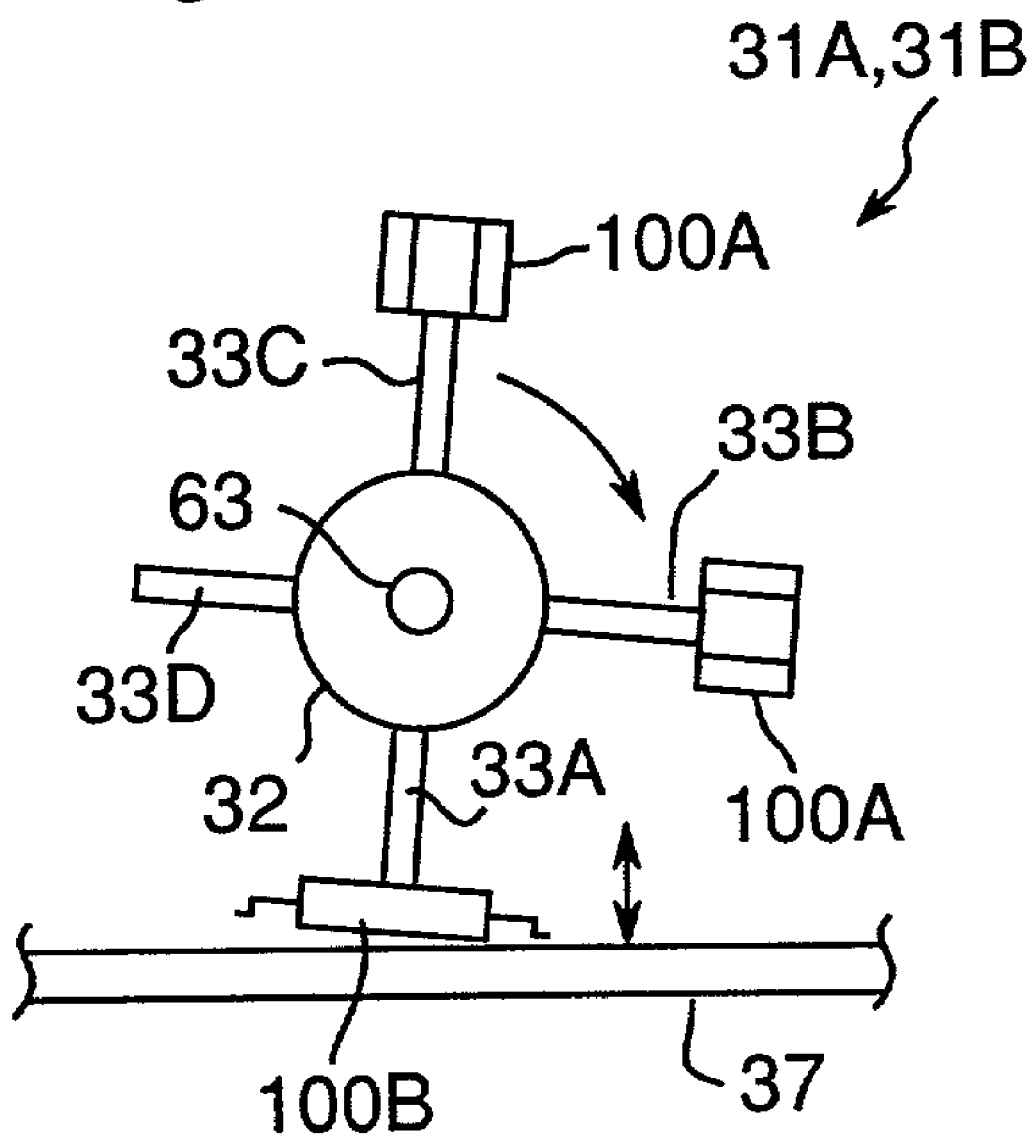
FIG. 29 is a schematic front view for describing a problem relating to a rotation speed of the rotary member.
Figure 30A:
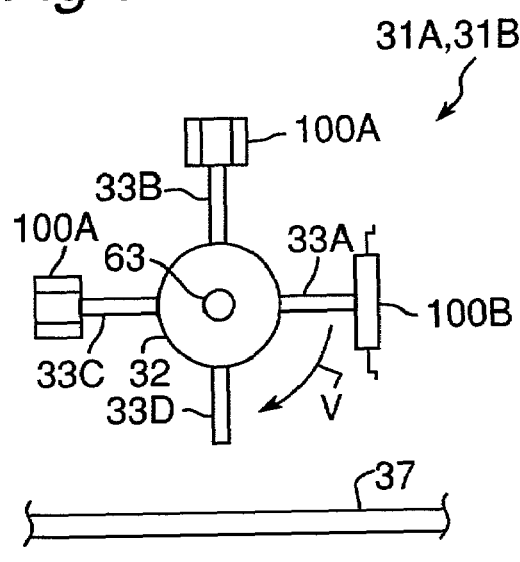
FIGS. 30A through 30D are schematic front views for describing a preferable control for the rotation speed of the rotary member.
Figure 30B:
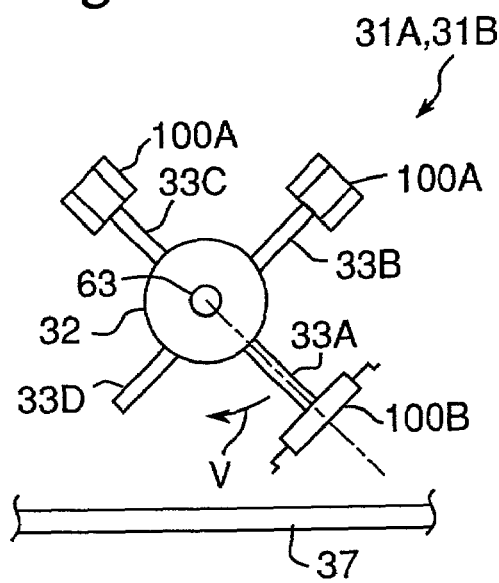
Figure 30C:
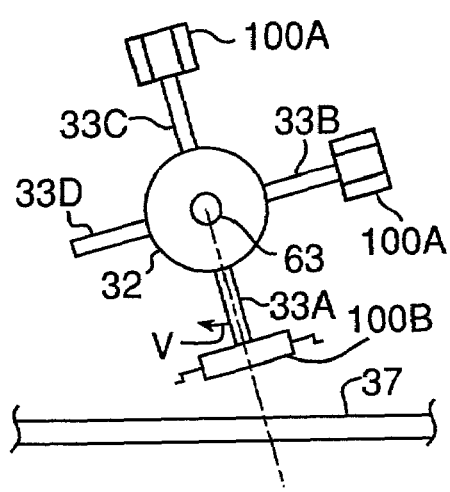
Figure 30D:
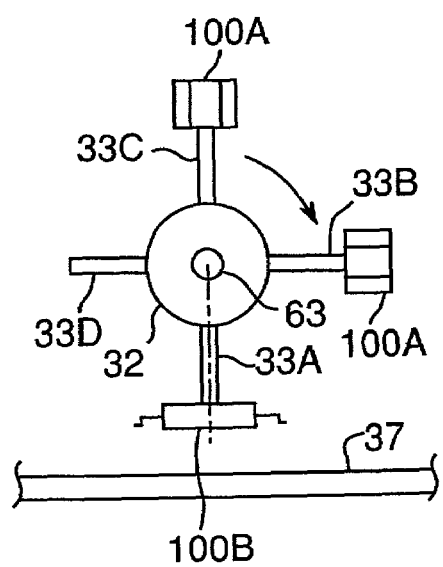

As shown in FIG. 29, if the rotation speed of the rotary member 32 during mounting is high immediately before the rotation is stopped, then the rotary member 32 can not be stopped at a correct rotary angular position due to the inertial force, resulting in that the component 100 sucked to the component suction nozzle 33 can not be positioned correctly with respect to the circuit board 37. Therefore, as shown in FIGS. 30A through 30D, it is preferable to change the rotation speed of the rotary member 32 between when the rotation is started and immediately before the rotation is stopped. An arrow V indicates rotation speed of the rotary member 32 in these FIGS. 30A through 30D. The more longer the length of the arrow V is, the more faster the rotation speed of the rotary member 32 is. When the rotation of the rotary member 32 is started, the rotation speed thereof is set relatively fast as shown in FIG. 30A. On the other hand, as the rotation body 32 approaches nearer to its stop position, the rotation speed thereof is decreased. Such control of the rotation speed of the rotary member 32 enables the rotary member 32 to reliably stop at its correct stop position shown in FIG. 30D, resulting in that the components to be mounted are positioned with respect to the circuit board 37 with high accuracy.

Figure 31A:
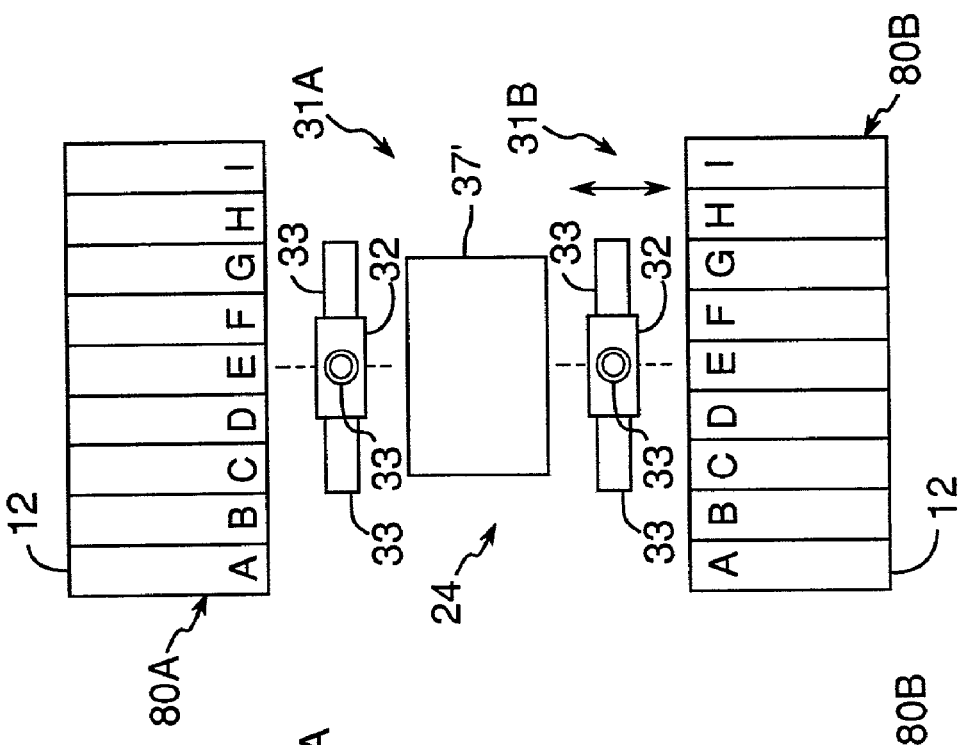
FIGS. 31A and 31B are schematic plan views for describing selective usage of two mounting head sections according to a type of a circuit board.
Figure 31B:
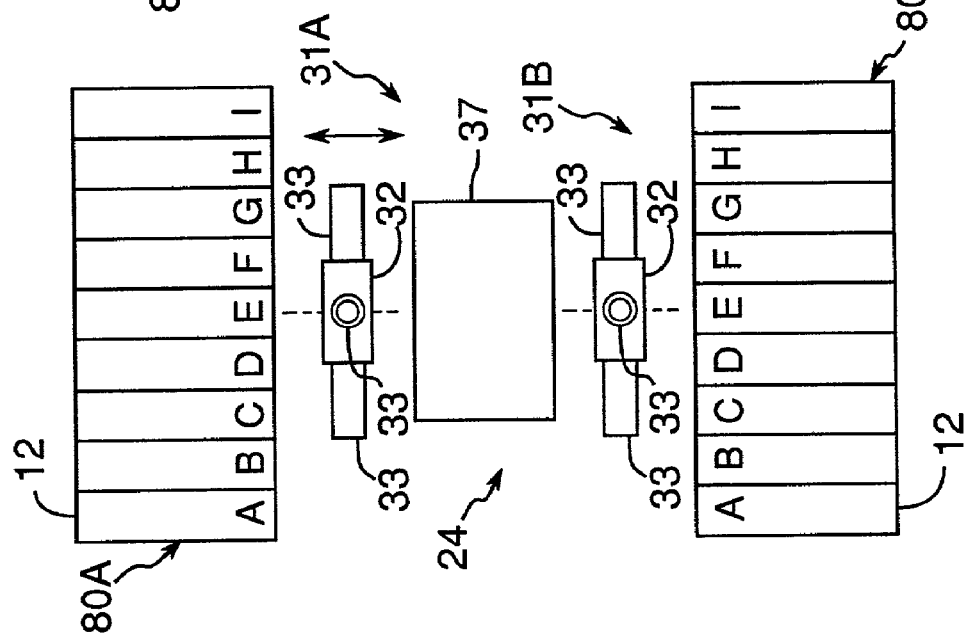
Figure 33:
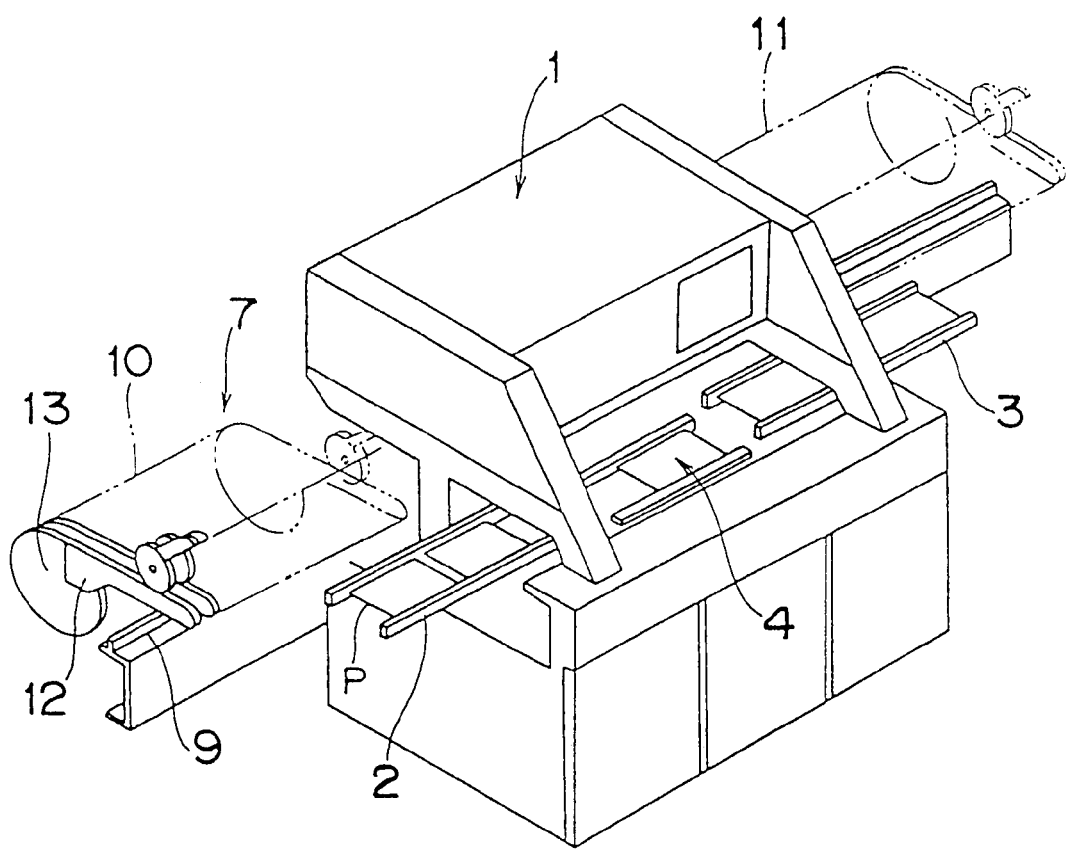
FIG. 33 is a perspective view of a conventional component mounting apparatus.
Figure 34:
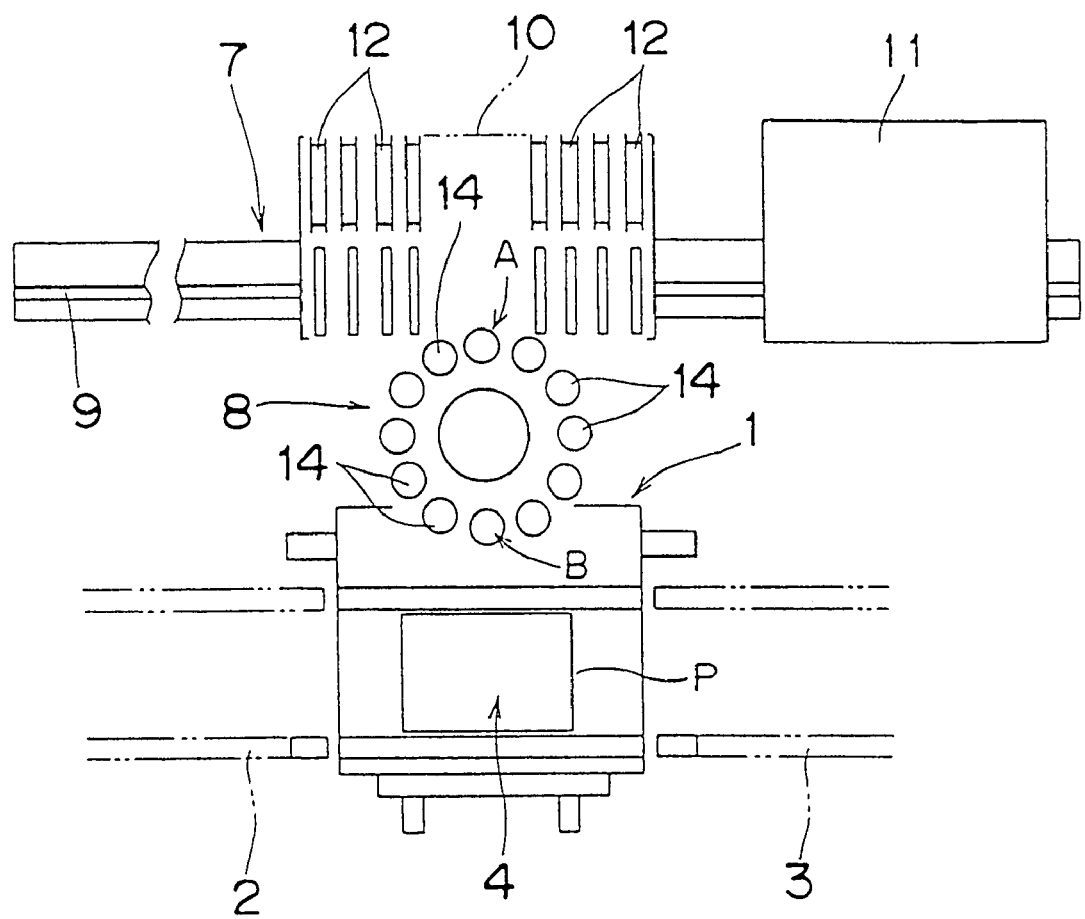
FIG. 34 is a schematic plan view of the above conventional apparatus.

In the embodiments described above, both of two mounting head sections 31A and 31B are used for mounting the components onto the single circuit board 37. However, either of the mounting head sections 31A and 31B may be used according to the type of the circuit boards 37. As shown schematically in FIGS. 31A and 31B, of two component supply tables 80A and 80B arranged on opposite sides of the board positioning section 24, one is mounted with a plurality of components supply means 12 designed specifically for components to be mounted one type (first type) of the circuit board, whereas the other is mounted with a plurality of component supply means 12 designed specifically for components to be mounted another type (second type) of the circuit board. Further, the one mounting head section 31A is designed specifically for the first type of the circuit board, whereas the other mounting head section 31B is designed specifically for the second type of the circuit board 37'. Accordingly, the one mounting head section 31A is only actuated when the components are mounted onto the first type of the circuit board 37, and the other mounting head section 31B is only actuated when the components are mounted onto the second type of the circuit board 37.

In case that one of the component supply means 12 mounted on the one component supply table 80A becomes out of components as shown in FIG. 32A, preferable procedures for exchanging the component supply means 12 to replenish the components are as follows. As shown in FIG. 32B, the mounting head section 31A corresponding to the component supply table 80A for which the replenishment of the components is required is caused to stop the suction, recognition, adjustment, and mounting. On the other hand, the mounting head section 31B corresponding to the component supply table 80B for which the replenishment is not required continues to perform the suction, recognition, adjustment, and mounting. The component supply table 80A with necessity for replenishment of the components is pulled out of the support frames 29 (refer to FIG. 6), so that the component supply table 12 running out of components is exchanged to new one. Thereafter, the component supply table 80A is installed between the support frames 29 to be fixed at a predetermined positioned. Finally, the mounting head section 31A corresponding to the component supply table 80A is caused to re-start the suction, recognition, adjustment, and mounting. This replenishment of the components under the situation where only one of the mounting head sections 31A and 31B is stopped its operation keeps reduction of the productivity of the component mounting apparatus due to the replenishment of components to a minimum.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A component mounting apparatus comprising:
   component supply sections for accommodating a plurality of components, said component supply sections being arranged on opposite sides of a board positioning sections, respectively;
   a first mounting head section including
   (i) a rotary member constructed and arranged to be rotatively driven about a horizontal axis,
   (ii) component suction nozzles attached to said rotary member along respective axes, and
   (iii) a recognition section opposed to said rotary member,
   said first mounting head section being constructed and arranged to
   (a) perform successive suction operations in order to pick up components from one of said component supply sections via said component suction nozzles, respectively,
   (b) perform, via said recognition section upon intermittent rotation of said rotary member, successive recognition operations of the components respectively sucked by said component suction nozzles, and
   (c) successively mount the components, respectively sucked by said component suction nozzles, onto a board at said board positioning section upon intermittent rotation of said rotary member; and
   a second mounting head section including
   (i) a rotary member constructed and arranged to be rotatively driven about a horizontal axis,
   (ii) component suction nozzles attached to said rotary member along respective axes, and
   (iii) a recognition section opposed to said rotary member,
   said second mounting head section being constructed and arranged to
   (a) perform successive suction operations in order to pick up components from another one of said component supply sections via said component suction nozzles, respectively,
   (b) perform, via said recognition section upon intermittent rotation of said rotary member, successive recognition operations of the components respectively sucked by said component suction nozzles, and
   (c) successively mount the components, respectively sucked by said component suction nozzles, onto the board at said board positioning section upon intermittent rotation of said rotary member.

2. The component mounting apparatus according to claim 1, wherein each of said first and second mounting head sections further includes nozzle rotation driving mechanisms for rotating corresponding said component suction nozzles, respectively, around the respective axes with respect to a corresponding said rotary member, and
   each of said component suction nozzles of said first and second mounting head sections is constructed and arranged to be rotated around its respective axis by a respective one of said nozzle rotation driving mechanisms in accordance with recognition results from a corresponding said recognition section, so as to perform successive adjustment of postures of the components sucked by said corresponding said component suction nozzles.

3. The component mounting apparatus according to claim 1, wherein said rotary member of each said first and second mounting head sections is constructed and arranged to be intermittently rotated at regular angular intervals at a corresponding one of said component supply sections,
   such that at an angular position of said rotary member where a corresponding one of said component suction nozzles is opposed to a component of said corresponding one of said component supply sections, another corresponding one of said component suction nozzles is opposed to a corresponding said recognition section.

4. The component mounting apparatus according to claim 1, wherein said rotary member of each said first and second mounting head sections is constructed and arranged to be intermittently rotated at regular angular intervals at a corresponding one of said component supply sections,
   such that a component sucked by a corresponding one of said component suction nozzles is opposed to a corresponding said recognition section during rotation of said rotary member.

5. The component mounting apparatus according to claim 1, wherein each of said first and second mounting head sections further includes an illuminator for illuminating the components sucked by corresponding said component suction nozzles when each of the components is opposed to a corresponding said recognition section.

6. The component mounting apparatus according to claim 1, wherein
   each of said first and second mounting head sections further includes
   (i) a head main body which includes a corresponding said rotary member,
   (ii) a frame which supports said head main body and a corresponding said recognition section, and
   (iii) an elevation mechanism for elevating said head main body with respect to said frame.

7. The component mounting apparatus according to claim 1, wherein
each of said first and second mounting head sections further includes:
(i) a head main body which includes a corresponding said rotary member,
(ii) a frame which supports said head main body and a corresponding said recognition section, and
(iii) an elevation mechanism for elevating said frame.

8. The component mounting apparatus according to claim 1, wherein
said rotary member of each said first and second mounting head sections is constructed and arranged to rotate at a lower speed at an end of rotation thereof with respect to a speed at a start of the rotation.

9. The component mounting apparatus according to claim 1, wherein
said first and second mounting head sections are independently movable between said component supply sections and said board positioning section, respectively, and
said first mounting head section is constructed and arranged to perform successive mounting of components onto the board positioned at said board positioning section while said second mounting head section performs successive component suction and recognition operations at a corresponding one of said component supply sections.

10. The component mounting apparatus according to claim 9, wherein
one of said first and second mounting head sections is constructed and arranged to mount components at high speed, and the other of said first and second mounting head sections is constructed and arranged to mount components that require mounting with a high degree of precision.

11. The component mounting apparatus according to claim 1, wherein
either of said first and second mounting head sections is constructed and arranged to be selectively operated in accordance with a type of board positioned at said board positioning section, and
one of said first and second mounting head sections is constructed and arranged to mount larger components, and the other of said first and second mounting head sections is constructed and arranged to mount smaller components.

12. The component mounting apparatus according to claim 1, wherein either of said first and second mounting head sections is constructed and arranged to perform suction of larger components after finishing suction of smaller components.

13. The component mounting apparatus according to claim 1, wherein
said first mounting head section is constructed and arranged to successively mount the components, respectively sucked by said component suction nozzles of said first mounting head section, onto the board at said board positioning section by mounting all of the sucked components before another component is picked up by any of said component suction nozzles of said first mounting head section, and
said second mounting head section is constructed and arranged to successively mount the components, respectively sucked by said component suction nozzles of said second mounting head section, onto the board at said board positioning section by mounting all of the sucked components before another component is picked up by any of said component suction nozzles of said second mounting head section.

14. The component mounting apparatus according to claim 1, wherein said component supply sections are arranged on opposite sides of a board transfer path in which is provided said board positioning section.

15. A component mounting apparatus comprising:
component supply sections for accommodating a plurality of components, said component supply sections being arranged on opposite sides of a board positioning section, respectively;
a first mounting head section including
(i) a first rotary member constructed and arranged to be rotatively driven about a horizontal axis, and
(ii) first component suction nozzles attached to said first rotary member along first respective axes;
a second mounting head section including
(i) a second rotary member constructed and arranged to be rotatively driven about a horizontal axis, and
(ii) second component suction nozzles attached to said second rotary member along second respective axes;
a first recognition section; and
a second recognition section,
wherein said first mounting head section is constructed and arranged to
(a) perform successive suction operations in order to pick up components from one of said component supply sections via said first component suction nozzles,
(b) move to said first recognition section so as to have performed, upon rotation of said first rotary member, successive recognition operations of the components respectively sucked by said first component suction nozzles, and
(c) successively mount the components, respectively sucked by said first component suction nozzles, onto a board at said board positioning section upon rotation of said first rotary member, and
wherein said second mounting head section is constructed and arranged to
(a) perform successive suction operations in order to pick up components from another one of said component supply sections via said second component suction nozzles,
(b) move to said second recognition section so as to have performed, upon rotation of said second rotary member, successive recognition operations of the components respectively sucked by said second component suction nozzles, and
(c) successively mount the components, respectively sucked by said second component suction nozzles, onto a board at said board positioning section upon rotation of said second rotary member.

16. The component mounting apparatus according to claim 15, wherein
said first mounting head section further includes first nozzle rotation driving mechanisms for rotating said first component suction nozzles about the first respective axes, respectively, with said first mounting head section also being constructed and arranged to rotate said first component suction nozzles, via said first rotation driving mechanisms, respectively about the first respective axes in accordance with recognition results from said first recognition section so as to perform successive adjustment of postures of the components sucked by said first component suction nozzles, and said second mounting head section further includes second nozzle rotation driving mechanisms for rotating said second component suction nozzles about the second respective axes, respectively, with said second mounting head section also being constructed and arranged to rotate said second component suction nozzles, via said second rotation driving mechanisms, respectively about the second respective axes in accordance with recognition results from said second recognition section so as to perform successive adjustment of postures of the components sucked by said second component suction nozzles.

17. The component mounting apparatus according to claim 16, wherein said first and second rotary members are each constructed and arranged to rotate at a lower speed at an end of rotation thereof with respect to a speed at a start of the rotation.

18. The component mounting apparatus according to claim 16, wherein said first and second mounting head sections are independently movable between said component supply sections and said board positioning section, respectively, and said first mounting head section is constructed and arranged to perform successive mounting of components onto the board positioned at said board positioning section while said second mounting head section is used to perform successive component suction at a corresponding one of said component supply sections and successive component recognition at said second recognition section.

19. The component mounting apparatus according to claim 18, wherein one of said first and second mounting head sections is constructed and arranged to mount components at high speed, and the other of said first and second mounting head sections is constructed and arranged to mount components that require mounting with a high degree of precision.

20. The component mounting apparatus according to claim 16, wherein either of said first and second mounting head sections is constructed and arranged to be selectively operated in accordance with a type of board positioned at said board positioning section, and one of said first and second mounting head sections is constructed and arranged to mount larger components, and the other of said first and second mounting head sections is constructed and arranged to mount smaller components.

21. The component mounting apparatus according to claim 16, wherein either of said first and second mounting head sections is constructed and arranged to perform suction of larger components after finishing suction of smaller components.

22. The component mounting apparatus according to claim 16, wherein either of said first and second mounting head sections is constructed and arranged to mount smaller components after mounting larger components.

23. The component mounting apparatus according to claim 15, wherein said first mounting head section is constructed and arranged to successively mount the components, respectively sucked by said first component suction nozzles, onto the board at said board positioning section by mounting all of the sucked components before another component is picked up by any of said first component suction nozzles, and said second mounting head section is constructed and arranged to successively mount the components, respectively sucked by said second component suction nozzles, onto the board at said board positioning section by mounting all of the sucked components before another component is picked up by any of said second component suction nozzles.

24. The component mounting apparatus according to claim 15, wherein said component supply sections are arranged on opposite sides of a board transfer path in which is provided said board positioning section.

25. A component mounting method comprising:

providing a component mounting apparatus including
(i) component supply sections for accommodating a plurality of components, said component supply sections being arranged on opposite sides of a board positioning section, respectively;
(ii) a first mounting head section having
(a) a first rotary member constructed and arranged to be rotatively driven about a first horizontal axis,
(b) first component suction nozzles attached to said first rotary member along respective first axes, and
(c) a first recognition section opposed to said first rotary member,
said first mounting head section being constructed and arranged to
(1) perform successive suction operations in order to pick up components from one of said component supply sections via said first component suction nozzles, respectively,
(2) perform, via said first recognition section upon intermittent rotation of said first rotary member, successive recognition operations of the components respectively sucked by said first component suction nozzles, and
(3) successively mount the components, respectively sucked by said first component suction nozzles, onto a board at said board positioning section upon intermittent rotation of said first rotary member, and
(iii) a second mounting head section having
(a) a second rotary member constructed and arranged to be rotatively driven about a second horizontal axis,
(b) second component suction nozzles attached to said second rotary member along respective second axes, and
(c) a second recognition section opposed to said second rotary member, said second mounting head section being constructed and arranged to
(1) perform successive suction operations in order to pick up components from another one of said component supply sections via said second component suction nozzles, respectively,
(2) perform, via said second recognition section upon intermittent rotation of said second rotary member, successive recognition operations of the components respectively sucked by said second component suction nozzles, and (3) successively mount the components, respectively sucked by said second component suction nozzles, onto the board at said board positioning section upon intermittent rotation of said second rotary member;

positioning said first mounting head section relative to one of the component supply sections;

rotating said first rotary member about said first horizontal axis, thereby successively sucking components from said one of said component supply sections via said first component suction nozzles;

simultaneously with the intermittent rotation of said first rotary member, using said first recognition section to recognize said components sucked by said first component suction nozzles;

positioning said first mounting head section relative to a board at said board mounting position; and then intermittently rotating said first rotary member about said first horizontal axis, thereby successively mounting onto said board said components sucked by said first component suction nozzles.

26. The method according to claim 25, further comprising:

prior to successively mounting to said board said components sucked by said first component suction nozzles, successively rotating said first component suction nozzles about said respective first axes, respectively, in accordance with recognition results from said first recognition section, thereby successively adjusting postures of said components sucked by said first component suction nozzles.

27. The method according to claim 26, further comprising:

when said one of said component supply sections needs to be replenished with components, replenishing said one of said component supply sections with components while (i) positioning said second mounting head section relative to another of the component supply sections, (ii) rotating said second rotary member about said second horizontal axis, thereby successively sucking components from said another of said component supply sections via said second component suction nozzles, (iii) simultaneously with the intermittent rotation of said second rotary member, using said second recognition section to recognize said components sucked by said second component suction nozzles, (iv) successively rotating said second component suction nozzles about said respective second axes, respectively, in accordance with recognition results from said second recognition section, thereby successively adjusting postures of said components sucked by said second component suction nozzles, (v) positioning said second mounting head section relative to said board at said board mounting position, and then (vi) intermittently rotating said second rotary member about said second horizontal axis, thereby successively mounting onto said board said components sucked by said second component suction nozzles.

28. The method according to claim 25, wherein successively mounting onto said board said components sucked by said first component suction nozzles comprises mounting all of said sucked components onto said board before another component is picked up by any of said first component suction nozzles.

29. The component mounting method according to claim 25, wherein said component supply sections are arranged on opposite sides of a board transfer path in which is provided said board positioning section.

30. A component mounting method comprising:

providing a component mounting apparatus including (i) component supply sections for accommodating a plurality of components, said component supply sections being arranged on opposite sides of a board positioning section, respectively;

(ii) a first mounting head section including (a) a first rotary member constructed and arranged to be rotatively driven about a horizontal axis, and (b) first component suction nozzles attached to said first rotary member along first respective axes;

(iii) a second mounting head section including (a) a second rotary member constructed and arranged to be rotatively driven about a horizontal axis, and (b) second component suction nozzles attached to said second rotary member along second respective axes;

(iv) a first recognition section; and (v) a second recognition section, wherein said first mounting head section is constructed and arranged to (1) perform successive suction operations in order to pick up components from one of said component supply sections via said first component suction nozzles, (2) move to said first recognition section so as to have performed, upon rotation of said first rotary member, successive recognition operations of the components respectively sucked by said first component suction nozzles, and (3) successively mount the components, respectively sucked by said first component suction nozzles, onto a board at said board positioning section upon rotation of said first rotary member, and wherein said second mounting head section is constructed and arranged to (1) perform successive suction operations in order to pick up components from another one of said component supply sections via said second component suction nozzles, (2) move to said second recognition section so as to have performed, upon rotation of said second rotary member, successive recognition operations of the components respectively sucked by said second component suction nozzles, and (3) successively mount the components, respectively sucked by said second component suction nozzles, onto a board at said board positioning section upon rotation of said second rotary member;

positioning said first mounting head section relative to one of said component supply sections;

rotating said first rotary member about said first horizontal axis, thereby successively sucking components from said one of said component supply sections via said first component suction nozzles; then moving said first mounting head section to said first recognition section, and using said first recognition section to recognize said components sucked by said first component suction nozzles;

positioning said first mounting head section relative to a board at said board mounting position; and then intermittently rotating said first rotary member about said first horizontal axis, thereby successively mounting onto said board said components sucked by said first component suction nozzles.

31. The method according to claim 30, further comprising:
prior to successively mounting to said board said components sucked by said first component suction nozzles, successively rotating said first component suction nozzles about said respective first axes, respectively, in accordance with recognition results from said first recognition section, thereby successively adjusting postures of said components sucked by said first component suction nozzles.

32. The method according to claim 31, further comprising:
when said one of said component supply sections needs to be replenished with components, replenishing said one of said component supply sections with components while
(i) positioning said second mounting head section relative to another of the component supply sections,
(ii) rotating said second rotary member about said second horizontal axis, thereby successively sucking components from said another of said component supply sections via said second component suction nozzles, then
(iii) moving said second mounting head section to said second recognition section, and using said second recognition section to recognize said components sucked by said second component suction nozzles,
(iv) successively rotating said first component suction nozzles about said respective first axes, respectively, in accordance with recognition results from said first recognition section, thereby successively adjusting postures of said components sucked by said first component suction nozzles,
(v) positioning said second mounting head section relative to said board at said board mounting position, and then
(vi) intermittently rotating said second rotary member about said second horizontal axis, thereby successively mounting onto said board said components sucked by said second component suction nozzles.

33. The method according to claim 30, wherein successively mounting onto said board said components sucked by said first component suction nozzles comprises mounting all of said sucked components onto said board before another component is picked up by any of said first component suction nozzles.

34. The component mounting method according to claim 30, wherein said component supply sections are arranged on opposite sides of a board transfer path in which is provided said board positioning section.

35. A component mounting assembly including component mounting apparatuses positioned along a board transfer path, each of said component mounting apparatuses comprising:
first and second component supply sections for accommodating a plurality of components, said component supply sections being arranged on opposite sides of a board positioning section, respectively;
a first mounting head section including
(i) a first rotary member constructed and arranged to be rotatively driven about a first horizontal axis,
(ii) first component suction nozzles attached to said first rotary member along respective first axes, and
(iii) a first recognition section opposed to said first rotary member,
said first mounting head section being constructed and arranged to
(a) perform successive suction operations in order to pick up components from said first component supply section via said first component suction nozzles, respectively,
(b) perform, via said first recognition section upon intermittent rotation of said first rotary member, successive recognition operations of the components respectively sucked by said first component suction nozzles, and
(c) successively mount the components, respectively sucked by said first component suction nozzles, onto a board at said board positioning section upon intermittent rotation of said first rotary member; and
a second mounting head section including
(i) a second rotary member constructed and arranged to be rotatively driven about a second horizontal axis,
(ii) second component suction nozzles attached to said second rotary member along respective second axes, and
(iii) a second recognition section opposed to said second rotary member,
said second mounting head section being constructed and arranged to
(a) perform successive suction operations in order to pick up components from said second component supply sections via said second component suction nozzles, respectively,
(b) perform, via said second recognition section upon intermittent rotation of said second rotary member, successive recognition operations of the components respectively sucked by said second component suction nozzles, and
(c) successively mount the components, respectively sucked by said second component suction nozzles, onto the board at said board positioning section upon intermittent rotation of said second rotary member,
wherein all of said first component supply sections are positioned on one side of the board transfer path, and all of said second component supply sections are positioned on another side of the board transfer path.

36. The component mounting assembly according to claim 35, wherein
said first mounting head section is constructed and arranged to successively mount the components, respectively sucked by said first component suction nozzles, onto the board at said board positioning section by mounting all of the sucked components before another component is picked up by any of said first component suction nozzles, and
said second mounting head section is constructed and arranged to successively mount the components, respectively sucked by said second component suction nozzles, onto the board at said board positioning section by mounting all of the sucked components before another component is picked up by any of said second component suction nozzles.

37. A component mounting assembly including component mounting apparatuses positioned along a board transfer path, each of said component mounting apparatuses comprising:

first and second component supply sections for accommodating a plurality of components, said component supply sections being arranged on opposite sides of a board positioning section, respectively;

a first mounting head section including
  (i) a first rotary member constructed and arranged to be rotatively driven about a horizontal axis, and
  (ii) first component suction nozzles attached to said first rotary member along first respective axes;

a second mounting head section including
  (i) a second rotary member constructed and arranged to be rotatively driven about a horizontal axis, and
  (ii) second component suction nozzles attached to said second rotary member along second respective axes;

a first recognition section; and
a second recognition section, wherein said first mounting head section is constructed and arranged to
  (1) perform successive suction operations in order to pick up components from said first component supply section via said first component suction nozzles,
  (2) move to said first recognition section so as to have performed, upon rotation of said first rotary member, successive recognition operations of the components respectively sucked by said first component suction nozzles, and
  (3) successively mount the components, respectively sucked by said first component suction nozzles, onto a board at said board positioning section upon rotation of said first rotary member, wherein said second mounting head section is constructed and arranged to
  (1) perform successive suction operations in order to pick up components from said second component supply sections via said second component suction nozzles,
  (2) move to said second recognition section so as to have performed, upon rotation of said second rotary member, successive recognition operations of the components respectively sucked by said second component suction nozzles, and
  (3) successively mount the components, respectively sucked by said second component suction nozzles, onto a board at said board positioning section upon rotation of said second rotary member, and wherein all of said first component supply sections are positioned on one side of the board transfer path, and all of said second component supply sections are positioned on another side of the board transfer path.

38. The component mounting assembly according to claim 37, wherein said first mounting head section is constructed and arranged to successively mount the components, respectively sucked by said first component suction nozzles, onto the board at said board positioning section by mounting all of the sucked components before another component is picked up by any of said first component suction nozzles, and said second mounting head section is constructed and arranged to successively mount the components, respectively sucked by said second component suction nozzles, onto the board at said board positioning section by mounting all of the sucked components before another component is picked up by any of said second component suction nozzles.

* * * * *